(12) United States Patent
Whetsel

(10) Patent No.: US 9,329,234 B2
(45) Date of Patent: May 3, 2016

(54) IC DIE TEST, SCAN, AND CAPTURE, SHIFT, AND UPDATE CIRCUITRY

(71) Applicant: Texas Instruments Incorporated, Dallas, TX (US)

(72) Inventor: Lee D. Whetsel, Parker, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/948,956

(22) Filed: Nov. 23, 2015

(65) Prior Publication Data

US 2016/0077152 A1   Mar. 17, 2016

Related U.S. Application Data

(62) Division of application No. 14/816,220, filed on Aug. 3, 2015, now Pat. No. 9,229,056, which is a division of application No. 14/026,324, filed on Sep. 13, 2013, now Pat. No. 9,128,149.

(60) Provisional application No. 61/702,968, filed on Sep. 19, 2012.

(51) Int. Cl.
*G01R 31/3177* (2006.01)
*G01R 31/3185* (2006.01)
*G01R 31/28* (2006.01)
*G01R 31/3183* (2006.01)

(52) U.S. Cl.
CPC ........ *G01R 31/3177* (2013.01); *G01R 31/2896* (2013.01); *G01R 31/3183* (2013.01); *G01R 31/318513* (2013.01); *G01R 31/318552* (2013.01); *G01R 31/318555* (2013.01); *G01R 31/318558* (2013.01); *G01R 31/318572* (2013.01); *G01R 31/318594* (2013.01)

(58) Field of Classification Search
CPC ............. G01R 31/2896; G01R 31/318552; G01R 31/3177; G01R 31/318555; G01R 31/318594; G01R 31/318558; G01R 31/318572; G01R 31/318513; G01R 31/3183
USPC .......... 714/726, 727, 729, 733, 734; 324/762.03, 762.06
See application file for complete search history.

(56) References Cited

U.S. PATENT DOCUMENTS

| 8,063,654 | B2 * | 11/2011 | Rahman et al. | 324/762.03 |
|---|---|---|---|---|
| 8,522,096 | B2 * | 8/2013 | Wang et al. | 714/731 |
| 8,561,001 | B1 * | 10/2013 | Goel | 716/130 |
| 8,751,994 | B2 * | 6/2014 | Goel | 716/122 |
| 8,793,547 | B2 * | 7/2014 | Loh et al. | 714/733 |

(Continued)

OTHER PUBLICATIONS van Driel, W.D.; Real, R. A; Yang, D.G.; Zhang, G.Q.; Pasion, J., "Combined Virtual Prototyping and Reliability Testing Based Design Rules for Stacked Die System in Packages," Thermal, Mechanical and Multi-Physics Simulation Experiments in Microelectronics and Micro-Systems, 2007. EuroSime 2007. International Conference on, vol., no., pp. 1,5, 16-1.*

Lewis, D.L.; Lee, H.-H.S., "Testing Circuit-Partitioned 3D IC Designs," VLSI, 2009. ISVLSI '09. IEEE Computer Society Annual Symposium on, vol., no., pp. 139,144, May 13-15, 2009.*

(Continued)

*Primary Examiner* — John J Tabone, Jr.
(74) *Attorney, Agent, or Firm* — Lawrence J. Bassuk; Frank D. Cimino

(57) ABSTRACT

This disclosure describes die test architectures that can be implemented in a first, middle and last die of a die stack. The die test architectures are mainly the same, but for the exceptions mentioned in this disclosure.

9 Claims, 19 Drawing Sheets

(56) References Cited

U.S. PATENT DOCUMENTS

| | | | |
|---|---|---|---|
| 8,924,802 B2* | 12/2014 | Whetsel | 714/727 |
| 8,977,919 B2* | 3/2015 | Whetsel | 714/729 |
| 2005/0287833 A1* | 12/2005 | Hsu | 439/66 |
| 2008/0315333 A1* | 12/2008 | Combi et al. | 257/415 |
| 2012/0324305 A1* | 12/2012 | Whetsel | 714/733 |
| 2013/0047047 A1* | 2/2013 | Whetsel | 714/727 |
| 2013/0093455 A1* | 4/2013 | Whetsel | 324/762.03 |
| 2013/0153896 A1* | 6/2013 | Whetsel | 257/48 |
| 2013/0219239 A1* | 8/2013 | Whetsel | 714/729 |
| 2014/0264400 A1* | 9/2014 | Lipson et al. | 257/88 |
| 2015/0082110 A1* | 3/2015 | Whetsel | 714/727 |
| 2015/0115990 A1* | 4/2015 | Whetsel | 324/754.03 |

OTHER PUBLICATIONS

Real, R. A; van Driel, W.D.; Yang, D.G.; Zhang, G.Q.; Pasion, J., "Stacking Dies: Combined Virtual Prototyping and Reliability Testing Based Design Rules," Electronic Components and Technology Conference, 2007. ECTC '07. Proceedings. 57th, vol., no., pp. 1720,1724, May 29, 2007-Jun. 1, 2007.*

Stucchi, M.; Perry, D.; Katti, G.; Dehaene, W., "Test structures for characterization of through silicon vias," Microelectronic Test Structures (ICMTS), 2010 IEEE International Conference on, vol., no., pp. 130,134, Mar. 22-25, 2010.*

* cited by examiner

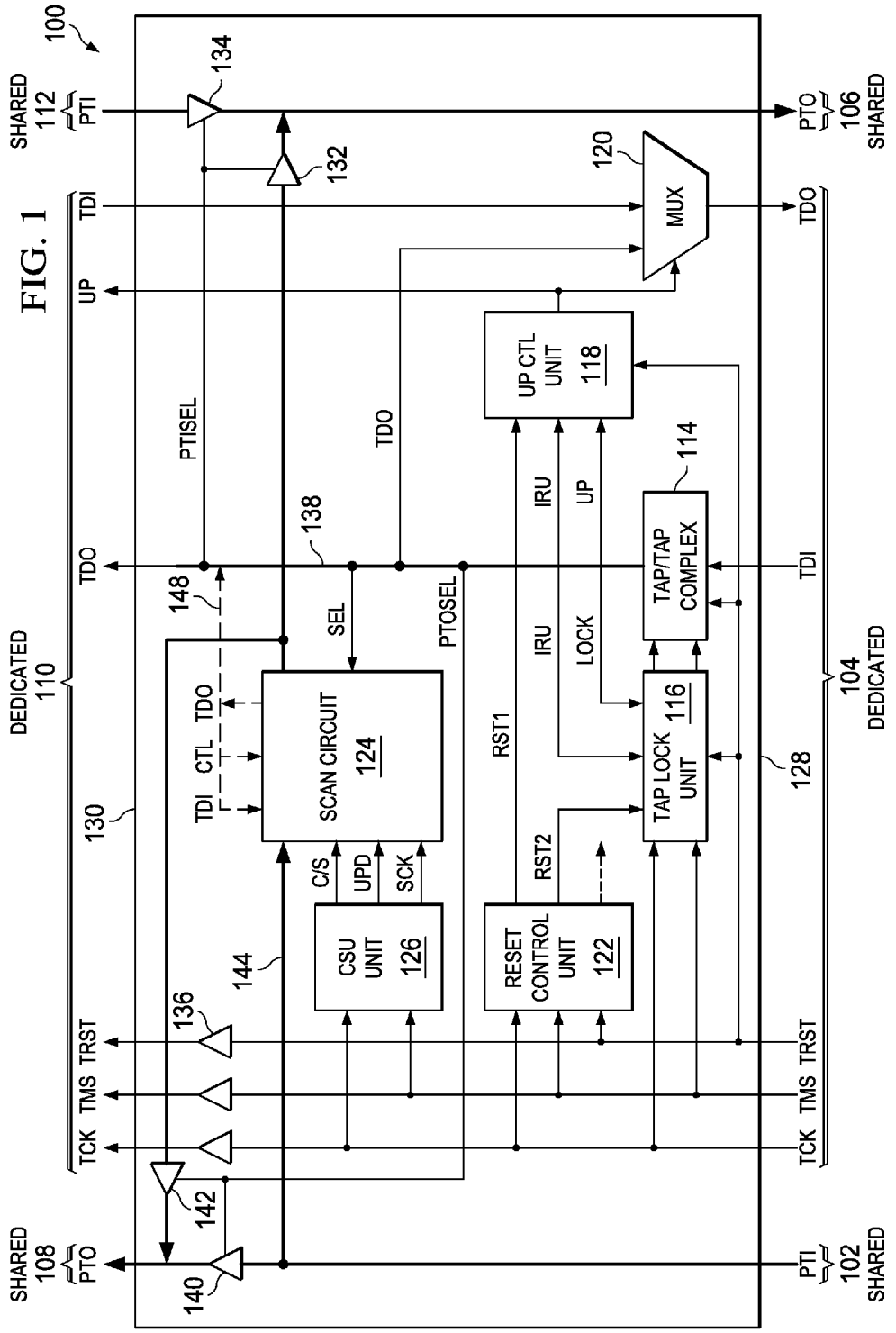

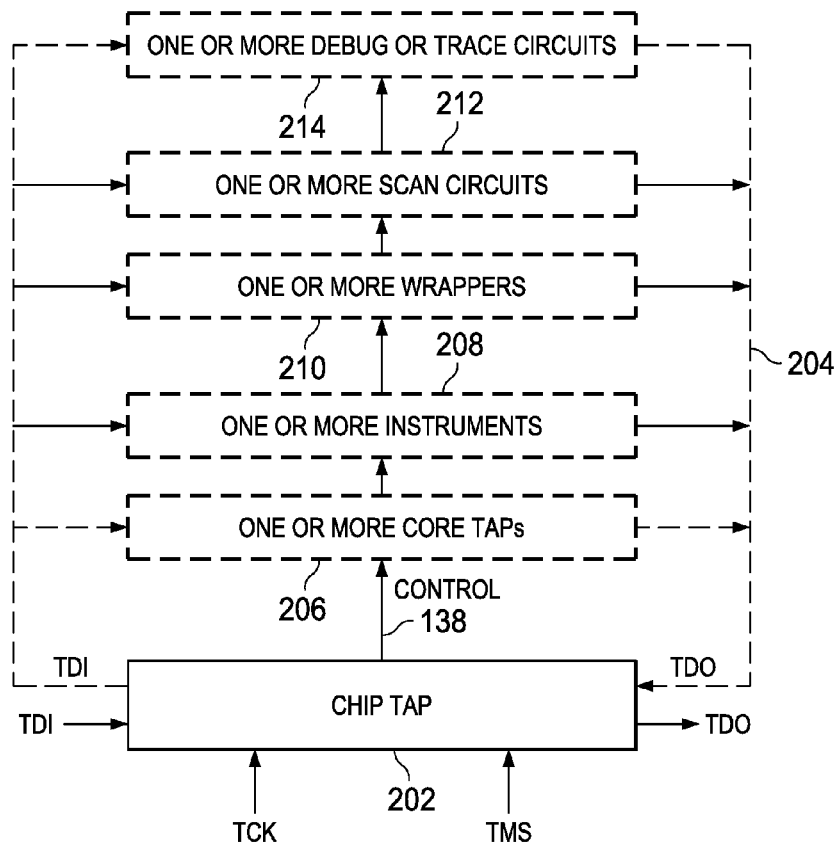
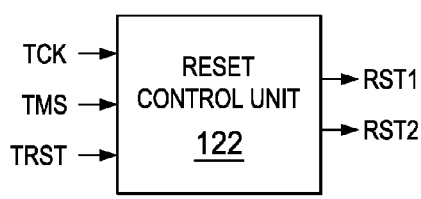
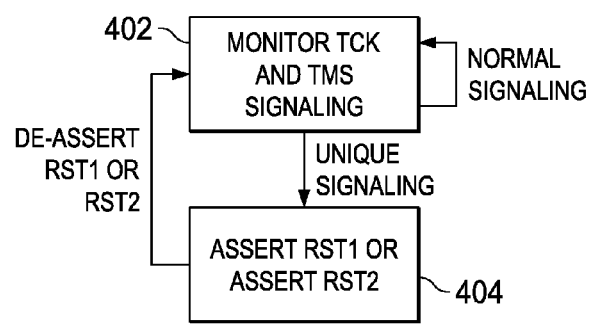

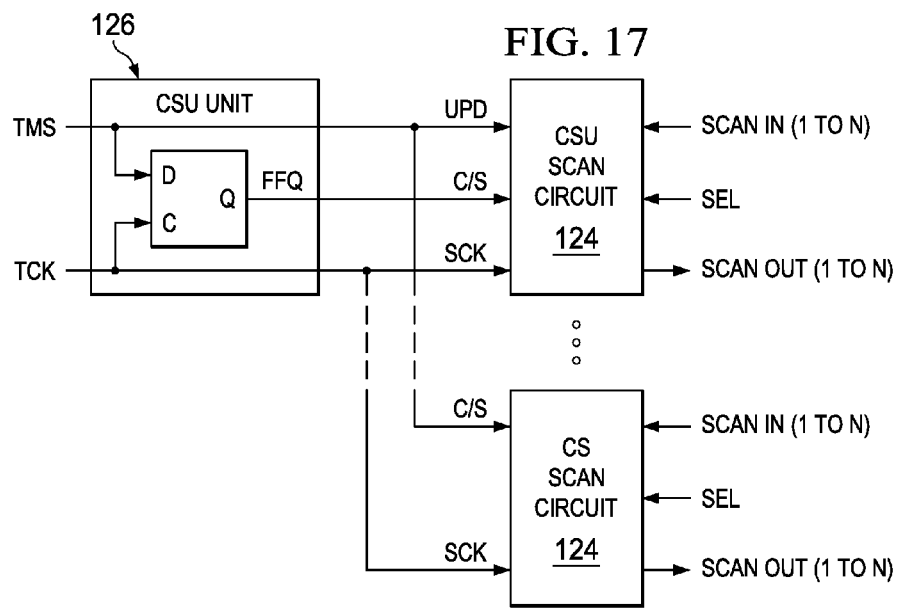
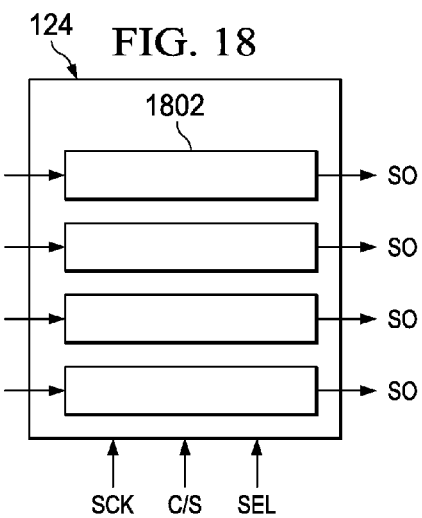
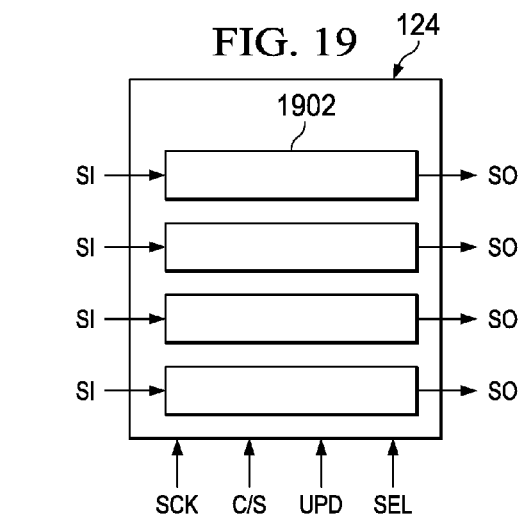

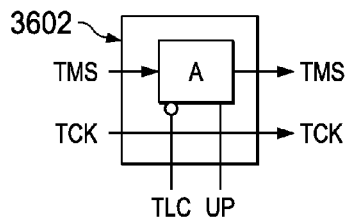
FIG. 38
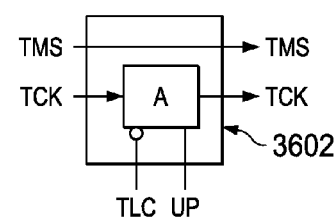
FIG. 39
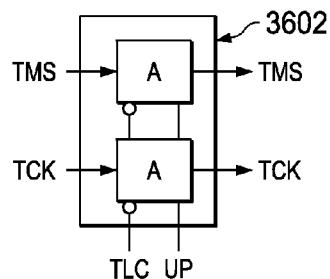
FIG. 40
FIG. 41
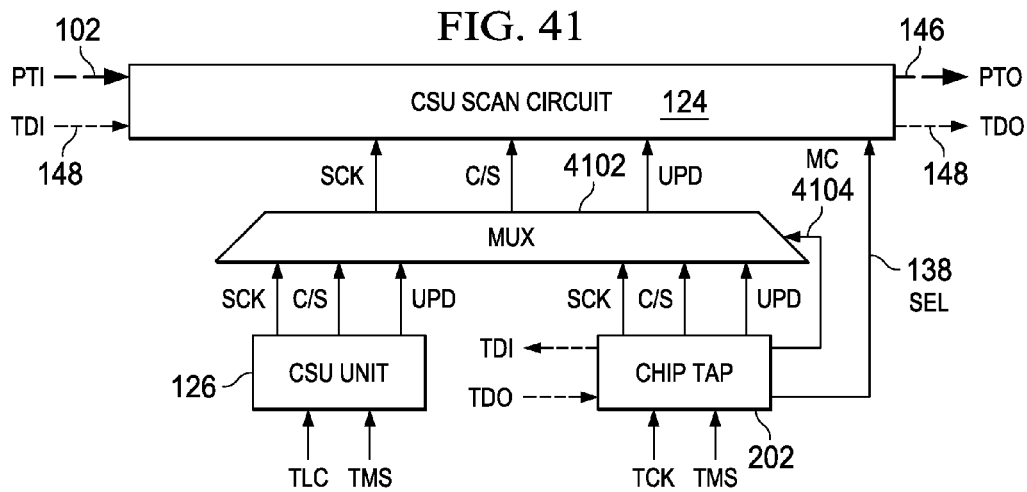
FIG. 42
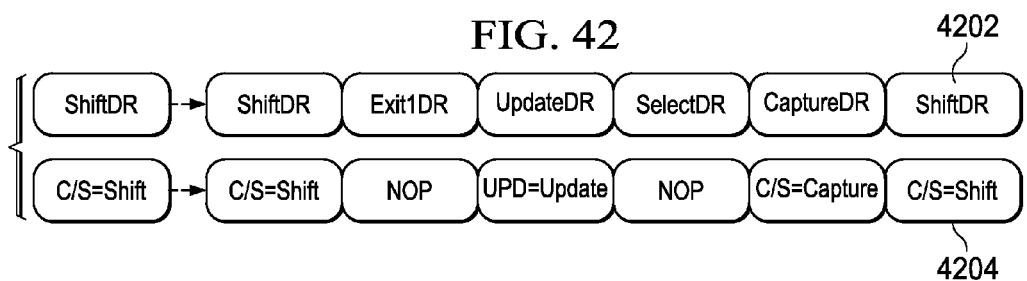

IC DIE TEST, SCAN, AND CAPTURE, SHIFT, AND UPDATE CIRCUITRY

RELATED APPLICATIONS

This Application is a divisional of prior application Ser. No. 14/816,220, filed Aug. 3, 2015, now U.S. Pat. No. 9,229,056, issued Jan. 5, 2016;

Which was a divisional of prior application Ser. No. 14/026,324, filed Sep. 13, 2013, now U.S. Pat. No. 9,128,149, issued Sep. 8, 2015;

Which claims priority from Provisional Application No. 61/702,968, filed Sep. 19, 2012.

This disclosure is related to pending patent application Ser. No. 13/587,522 (TI-71343), filed Aug. 16, 2012, which is incorporated herein by reference.

FIELD OF DISCLOSURE

This disclosure relates to die test architectures that are designed to be used in a 3D die stack.

BACKGROUND OF THE DISCLOSURE

Die manufactured for use in a die stack must be designed to enable testing of each die in the stack, bottom die, one of more middle die and the top die. Each die level, bottom, middle and top must be designed to include slightly different but compatible test architectures. This disclosure describes architectures for bottom, middle and top die in a stack of die.

BRIEF SUMMARY OF THE DISCLOSURE

This disclosure provides test architectures for die intended to be placed as the bottom die in the stack, a middle die in the stack or the top die in the stack. The architectures for each die in the stack are designed to interoperate with other die in the stack. All the test architectures are based on the IEEE 1149.1 standard. Improvements to the IEEE 1149.1 standard are included in this disclosure that enable improved testing of one, more or all die in the stack, that are designed according to the teachings of this disclosure.

DESCRIPTIONS OF THE VIEWS OF THE DISCLOSURE

FIG. 1 illustrates a first die in a stack containing the test architecture of the disclosure.

FIG. 2 illustrates the TAP/TAP Complex of the disclosure.

FIG. 3 illustrates the Reset Control Unit of the disclosure.

FIG. 4 illustrates a state diagram of the operation of the Reset Control Unit.

FIG. 17 illustrates a CSU Circuit controlling a CSU Scan Circuit and a CS Scan Circuit.

FIG. 18 illustrates a CS Parallel Scan Circuit.

FIG. 19 illustrates a CSU Parallel Scan Circuit.

FIGS. 38-40 illustrate various gating implementations of the gating circuit of FIGS. 36 and 37.

FIG. 41 illustrates a test architecture of the disclosure further including a multiplexer for allowing the SCK, C/S and UPD signals from either the CSU Unit or the Chip TAP to be coupled to the SCK, C/S and UPD signals of a CSU Scan Circuit.

FIG. 42 illustrates Shift, Capture and Update operations generated from the Chip TAP to control a CSU Scan Circuit via the multiplexer.

DETAILED DESCRIPTION OF THE DISCLOSURE

Figure 5:
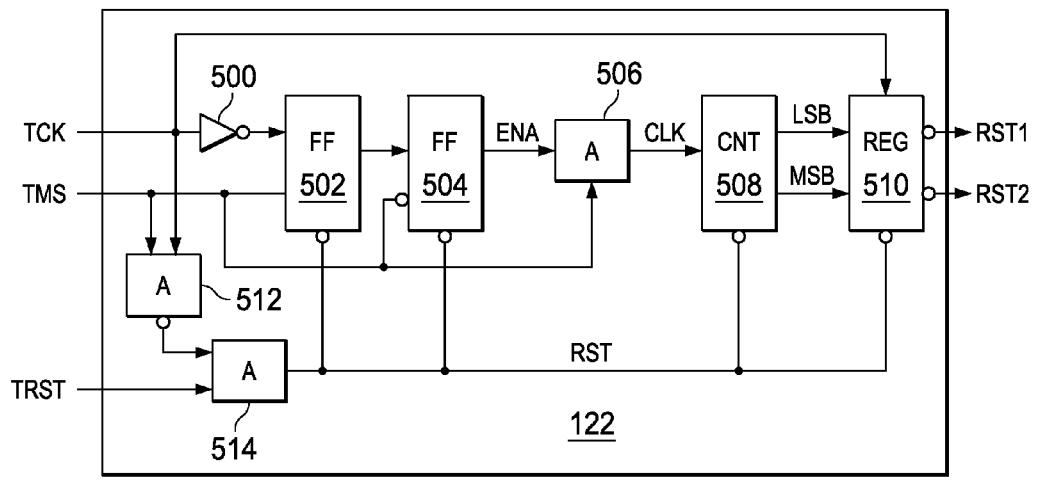
FIG. 5 illustrates an example implementation of the Reset Control Unit.

FIG. 1 illustrates a die 100 including the test architecture of a bottom die in a stack, according to the disclosure. Die 100 includes a bottom surface 128 and a top surface 130. The bottom surface 128 will be connected to a substrate on which the die stack will eventually be mounted upon. The top surface 130 will be connected to a middle die in the stack, or if the stack only includes two layers of die stacking, to the top die in the stack. The bottom surface 128 includes contact points for input and output signaling, including Parallel Test Input (PTI) signals 102, IEEE 1149.1 TCK, TMS, TRST, TDI and TDO signals 104 and Parallel Test Output (PTO) signals 106. The top surface 130 includes contact points for input and output signaling, including PTO signals 108, IEEE 1149.1 TCK, TMS, TRST, TDI and TDO signals 110 and PTI signals 112. As noted in the diagram, the PTI and PTO signaling between the bottom 128 and top 130 surfaces of the die 100 are shared between being used functionally and being used during testing of the die or die stack. Also as seen, the IEEE 1149.1 signals on the bottom surface 128 and top surface 130 of the die 100 are dedicated for test access and are not shared for functional signaling. Thus while the shared signaling 102, 108, 106 and 112 may be operating functional signaling between the die in the stack, the dedicated 1149.1 signals 104 and 110 are readily available to access embedded circuitry such as, but not limited to, test circuitry, debug circuitry, trace circuitry, instrumentation circuitry to provide real time information of the die in the stack during their functional operation mode.

The test architecture of bottom die 100 includes a TAP or TAP Complex 114, a TAP Lock Unit 116, an Up Control Unit 118, a Reset Control Unit 122, a Capture Shift Update Unit 126, at least one Scan Circuit 124, a TDO Multiplexer 120, PTO buffers 128 and 130, PTI buffers 132 and 134, and TCK, TMS and TRST buffers 136. The connectivity between all of these architectural circuit elements and to the external signals on surfaces 128 and 130 are clearly indicated in the FIG. 1. The following descriptions define the purpose and function of each circuit element.

The TAP/TAP Complex 114 receives the TRST signal and TDI signal from surface 128, and TMS and TCK signals from TAP Lock Unit 116. The TAP/TAP Complex 114 outputs a bus of signals 138. The bus of signals 138 includes control signals and a TDO signal. The TAP/TAP Complex may simply be a TAP as defined in IEEE 1149.1 or it may be expanded into a TAP Complex containing more circuitry than that defined in IEEE standard 1149.1. A detail view and description of the TAP/TAP Complex 114 will be given in FIG. 2 of the disclosure. The TAP/TAP Complex functions to control the operation of the other circuit elements in the test architecture of FIG. 1. The TAP/TAP Complex communicates data using the TDI input and TDO output, as described in IEEE standard 1149.1.

The TAP Lock Unit 116 receives the TRST, TMS and TCK signals from surface 128, a Lock signal, and Instruction Register Update signal from bus 138 and a Reset 2 (RST2) signal from the Reset Control Unit 122. The TAP Lock Unit 116 outputs a TMS signal and TCK signal to TAP/TAP Complex 114. A detail description of the TAP Lock Unit 116 will be given in regard to FIGS. 8-11. The TAP Lock Unit functions to either allow the TMS and TCK signals to pass through it to conventionally control the TAP/TAP Complex or to block off (Lock) the TMS and TCK signals from conventionally controlling the TAP/TAP Complex. When the TMS and TCK signals are blocked off from TAP/TAP Complex 114, the TMS and TCK signals can be used to control test and other operations in the die.

The Up Control Unit 118 receives the TRST signal from surface 128, an UP signal and an Instruction Register Update signal from bus 138 and a Reset 1 (RST1) signal from Reset Control Unit 122. The Up Control Unit 118 outputs an Up signal to Mux 120 and to surface 130. A detail description of the Up Control Unit 118 will be given in FIG. 12. The Up Control Unit 118 functions provide the Up output signal to either enable a die connected to surface 130 of die 100 to be enabled to operate with bottom die 100 or to disable a die connected to surface 130 from being enabled to operate with bottom die 100. If the Up output is set to enable a die connected to surface 130, the Up output will also enable Mux 120 to select the TDI input from the die connected to the surface 130 of die 100. It is important to note that the concept of an Up Control Unit 118 shown in this disclosure is itself not novel. The concept of Up Control Units has been described in art prior to this disclosure. In conventional Up Control Units, the Up output is set by loading an instruction into a TAP Instruction Register to set the Up output. Then another instruction is loaded into the TAP Instruction Register to reset the Up output. According to this disclosure, the Up output of the Up Control Unit is set in response to an instruction loaded into a TAP Instruction register, as per the prior art, but the resetting of the Up output of the Up Control Unit is performed by the Reset Control Unit of this disclosure, not by having to load an instruction into the TAP Instruction Register. What is novel about the Up Control Unit 118 in this disclosure is the use of the RST1 input from Reset Control Unit 122 to reset the Up Control Unit after it has been set in response to the UP and IRU inputs from an instruction loaded into the TAP/TAP Complex 114.

The Reset Control Unit 122 receives the TRST, TMS and TCK signals from surface 128 and outputs RST1 and RST2 signals to the Up Control Unit 118 and TAP Lock Unit 116 respectively. The function of the Reset Control Unit 122 is to respond to unique signaling on the TMS and TCK inputs to produce the RST1 or RST2 output signals. The unique signaling on the TMS and TCK signals are not recognizable by the TAP/TAP Complex 114, they are completely transparent and invisible to TAP/TAP Complex 114. As indicated in dotted line, the Reset Control Unit 122 may output additional reset or other types of signals in addition to the RST1 and RST2 signals shown in FIG. 1, in response to receiving unique signaling on TMS and TCK. Thus, and according to this disclosure, the purpose and realization of the Reset Control Unit 122 to recognize and respond to unique signaling on TMS and TMS to output signals is broad and is not limited to outputting only the RST1 and RST2 signals of this disclosure as shown in FIG. 1. A detailed description of the Reset Control Unit 122 will be given in FIGS. 3-7.

The Capture Shift and Update (CSU) Unit 126 receives the TMS and TCK signals from surface 128 and outputs Capture/Shift (C/S), Update (UPD) and Scan Clock (SCK) outputs to Scan Circuit 124. The function of the CSU Unit is to convert TMS and TCK signals into C/S, UPD and SCK signals that control scan operation in Scan Circuit 124. Importantly, the conversion of the two TMS and TCK signals into the three C/S, UPD and SCK signals is performed such that the C/S, UPD and SCK signals occur as if they were provide directly from surface 128 of die 100. The CSU Unit 126 is novel and provides the ability to operate Scan Circuit 124 in an at-speed mode of testing to enable high speed, timing closure and transition delay testing of Scan Circuit 124, which is not possible using the TAP/TAP Complex 114. A detailed description of CSU Unit 126 is given in FIGS. 13-17.

Scan Circuit 124 receives the C/S, UPD and SCK signals from the CSU Unit 126, a Select (SEL) input from bus 138, PTI signals 102 from surface 128 and optionally, via dotted line, a TDI, Control (CTL) and TDO signals 148 from bus 138. Scan Circuit 124 outputs PTO signals 146 to PTO bus 106 when buffer 132 is enabled by the Parallel Test Input Select (PTISEL) signal from bus 138. Scan Circuit 124 can be tested in a parallel mode using control signals from CSU Unit 126 to input PTI signals 144 from PTI 102 and to output PTO signals 146 to PTO 106, if buffer 132 is enabled. If another die is mounted on surface 130 of die 100, the PTO outputs 146 from scan Circuit 124 can be passed up into the mounted die via PTO signals 108, if buffer 142 is enabled by a Parallel Test Output Select (PTOSEL) signal from bus 138. The PTO outputs from a mounted die are passed to PTO 106 of die 100 via PTI 112 and by enabling buffer 134 using the PTISEL signal. Alternately, Scan Circuit 124 can be tested in a serial mode via the TDI, CTL and TDO signals 148 from bus 138, shown in dotted line. Detailed descriptions of example Scan Circuits 124 is given in FIGS. 18-26.

Mux 120 receives the Up control signal from Up CTL Unit 118, the TDO output of TAP/TAP Complex 114, via bus 138 and the TDI input on surface 130. Mux 120 outputs a selected TDO signal to the TDO of surface 130.

Buffers 136 are used to buffer the TCK, TMS and TRST signals from surface 128 to surface 130 of die 100.

Buffers 140 and 142 serve to output either the PTI signals 102 from surface 128 to the PTO signals 108 of surface 130 or the PTO signals 146 from Scan Circuit 124 to the PTO signals 108 of surface 130. The PTOSEL signal from bus 138 is used to enable either buffer 140 or buffer 142. Buffers 140 and 142 operate as a switch or other type multiplexing circuit controlled by the PTOSEL signal.

Buffers 132 and 134 serve to output either the PTO signal 146 from Scan Circuit 124 to the PTO signals 106 of surface 128 or the PTI signals 112 of surface 130 to the to the PTO signals 106 of surface 130. The PTISEL signal from bus 138 is used to enable either buffer 132 or 134. Buffers 132 and 134 operate as a switch or other type multiplexing circuit controlled by the PTISEL signal.

FIG. 2 illustrates and example implementation of TAP/TAP Complex 114 of FIG. 1, according to the disclosure. The TAP/TAP Complex 114 includes, at minimum, a Chip TAP 202 as defined in IEEE 1149.1. The Chip TAP includes TDI, TCK and TMS inputs, a TDO and the Control Bus 138 output of FIG. 1. The Chip TAP 202 controls access to all circuit elements described in FIG. 1. According to the disclosure, Chip TAP 202 may be the entirety of TAP/TAP Complex 114. However, and according to the disclosure, Chip TAP 202 may be expanded to include additional circuitry 204 creating a TAP Complex. A TAP Complex, according to the disclosure, may include one or more of the following circuits. (1) One or more (IEEE 1149.1 compliant or non-compliant) TAPs 206. (2) One or more (IEEE P1687 compliant or non-compliant) Instruments. (3) One of more (IEEE 1500 compliant or non-compliant) Core Wrappers. (4) One or more Scan Circuits, of various types, including parallel or serial scan circuits or test compression scan circuits. (5) One or more circuits designed for debugging the functional circuitry within a die. (6) One or more circuits designed for tracing the functional interaction of circuitry within a die.

FIG. 3 illustrates the Reset Control Unit 122 of FIG. 1, including TCK, TMS and TRST inputs and RST1 and RST2 outputs. While not shown, the dotted line output of Reset Control Unit 122 includes the possibility of additional outputs as shown and described in regard to FIG. 1.

FIG. 4 illustrates the basic state diagram of operation of the Reset Control Unit 122 of FIG. 3. The Reset Control Unit 122 powers up in state 402, monitoring TCK & TMS Signaling. The Reset Control Unit 122 will remain in state 402 as long as it detects Normal TCK and TMS signaling as defined in IEEE 1149.1. If the Reset Control Unit detects Unique Signaling on TCK and TMS, differing from the IEEE 1149.1 signaling, it will transition to state 404. In state 404, the Reset Control Unit will decode the unique signaling and, in this example, will assert either the RST1 or RST 2 signal depending on the decoding of the unique signaling. The RST1 or RST2 signals perform the resetting operations described in FIG. 1. RST1 will reset the Up Control Unit 118 and RST2 will reset the TAP Lock Unit 116. After executing the desired RST output signal, the Reset Control Unit will de-assert the RST1 or RST2 signal and will transition back to state 402 to again resume monitoring for Normal or Unique TCK and TMS signaling.

FIG. 5 illustrates one example implementation of Reset Control Unit 122. The Reset Control Unit includes; inverter 500, FF's 502 and 504, AND gates 506 and 514, NAND gate 512, 2-bit counter (CNT) 508 and 2-bit register (REG) 510, all connected as shown. TMS is a data input to FF 502 and a clock input to REG 510. TMS is a clock input to FFs 502 and 504 and a gated clock input to CNT 508, via AND gate 506. TRST is a reset input to FF's 502, CNT 508 and REG 510, via AND gate 514. TCK and TMS are also serve to provide a reset input to FF's 502 and 504, CNT 508 and REG 510, via NAND Gate 512 and AND gate 514. TCK and TMS produce a reset signal from AND gate 514 if both signals are high. REG 510 outputs the RST1 and RST2, which, in this example are shown to be low active reset signals. The easiest way to describe the operation of Reset Control Unit 122 is through the use of unique TMS and TCK timing diagrams of FIGS. 6 and 7.

Figure 6:
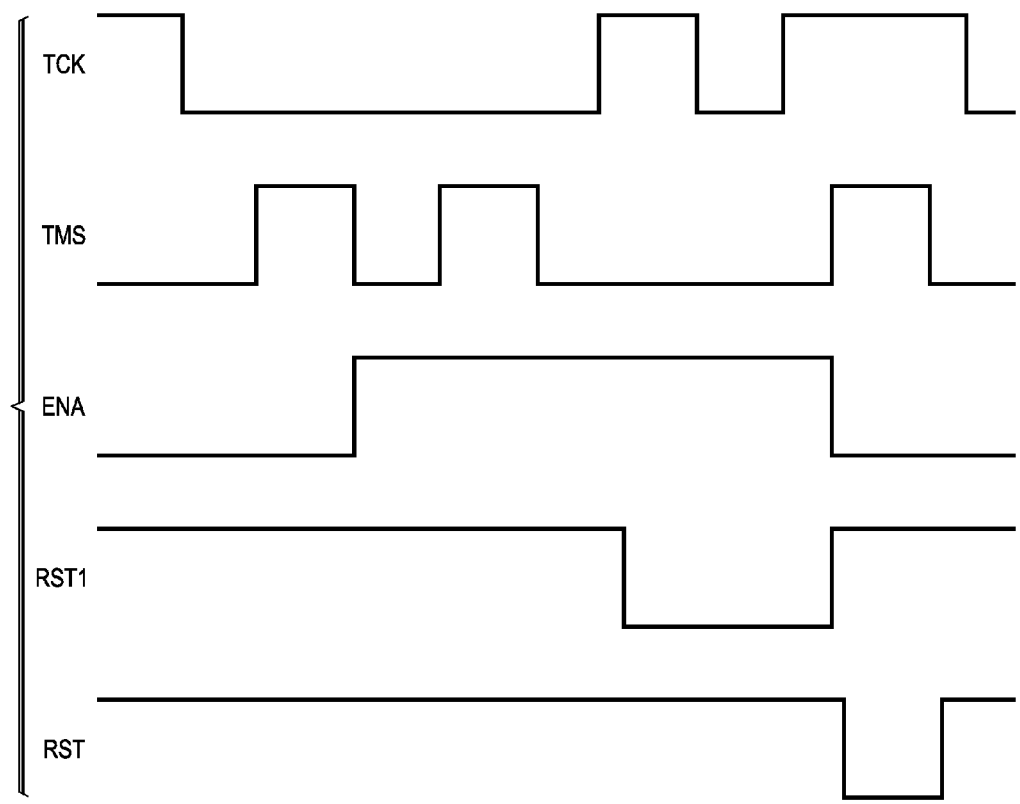
FIG. 6 illustrates a RST1 timing sequence.

FIG. 6 illustrates the unique TMS and TCK signaling to produce a RST1 signal output from Reset Control Unit 122 of FIG. 5. As seen at the beginning (left) of the unique signaling sequence, the TCK signal is driven low, which disables/freezes the clocking of the TAP/TAP Complex 114 of FIG. 1. Then 2 clock signals are provided on TMS. The rising edge of the first TMS clock loads a high from inverter 502 into FF 502. The falling edge of the first TMS clock loads the high from FF 502 into FF 504, which sets a high on the ENA input of AND gate 506. The second TMS clock signal passes through the enabled AND gate 506 to clock the CNT 508 from a count of "0" to a count of "1". The least significant bit (LSB) of CNT 508 is set high in response to the second TMS clock. A clock is then provided on the TCK input to clock in the high on the LSB and a low on the most significant bit (MSB) of CNT 508 into REG 510, which causes a low on the RST1 output of REG 510, while the RST2 output remains high. The low on RST1 effectuates the resetting of the Up Control Unit 118 of FIG. 1. After this unique signaling to provide a reset signal on RST1, the TCK is set high and a clock is applied on TMS. In this instance and logically as shown in FIG. 5, TMS and TCK both being set high creates reset (RST), equal to the duration of TMS being high, from the output from AND gate 514, which resets FFs 502 and 504, CNT 508 and REG 510. Following this sequence, TCK is again set low, as is TMS. From this point forward, access to the only the bottom die 100 is gained. All other access to upper die mounted on die 100 is disabled from this point forward.

Figure 7:
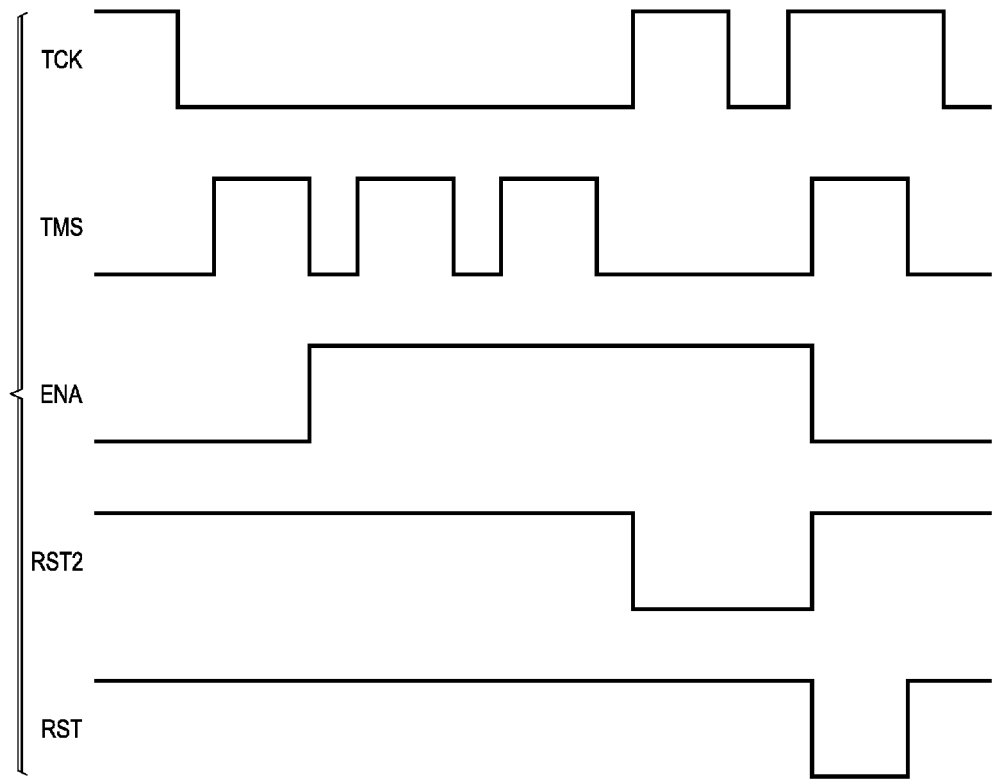
FIG. 7 illustrates a RST 2 timing sequence.

FIG. 7 illustrates a TMS and TCK protocol that is identical to FIG. 6. The only difference is that there are three clocks produced on TMS instead of two. The third clock on TMS clocks the CNT 508 two times which sets the MSB bit of CNT 508, asserting the RST2 output from REG 510 low to reset the TAP Lock Unit 116.

It should be fully understood that the logic levels produced on the RST1 and RST2 outputs the example implementation of FIG. 5 are for that particular implementation of the Reset Control Unit 122. Indeed, this is just one example of implementation of the disclosure and other implementations may be conceived and provided. For example, a different design of the Reset Control Unit 122 may activate RST1 and RST 2 to be of opposite logic levels than shown in the example implementation of FIG. 5. For example, a high logic level on either of the two outputs may be the desired reset state instead of a logic low. It is purely by design choice.

Figure 8:
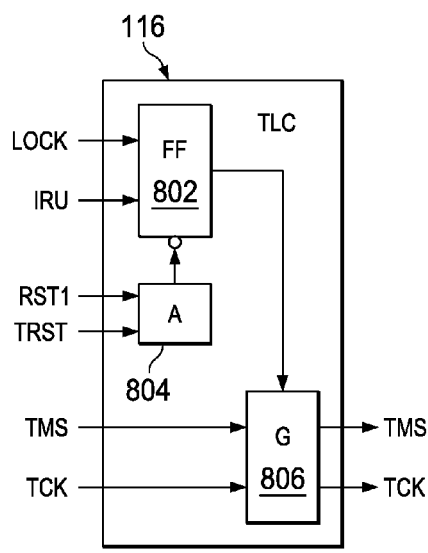
FIG. 8 illustrates an example implementation of the TAP Lock Unit.

FIG. 8 illustrates one example implementation of the TAP Lock Unit 116, which consists of a FF 802, AND gate 804 and gating circuit 806. In response to an IRU clock output from TAP 114 and when the Lock signal is asserted, FF 802 is set and outputs a signal to gating 806 which disables the TMS and/or TCK signals from passing through gating circuit 806. This action basically freezes the TAP 114 in its present state, regardless of activity on the TMS and TCK signals. The TAP is locked. In response to either a low on RST1 from Reset Control Unit 122 or TRST, FF is reset via AND gate 804 and the TAP 114 is once again enabled to respond to TMS and TCK signals. This is one implementation of the TAP Lock Unit and many more could be realized by clever designers, but the basic concept of setting FF 802 via an instruction and the resetting of FF 802 via the RST1 output from Reset Control Unit 122 is clearly illustrated in FIG. 8.

Figure 9:
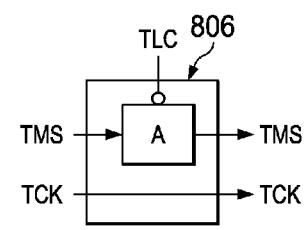
FIGS. 9-11 illustrate various implementations of the Gating circuit of the TAP Lock Unit.
Figure 10:
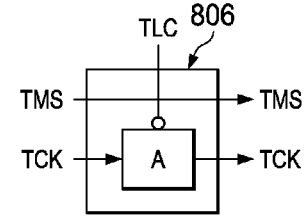
Figure 11:
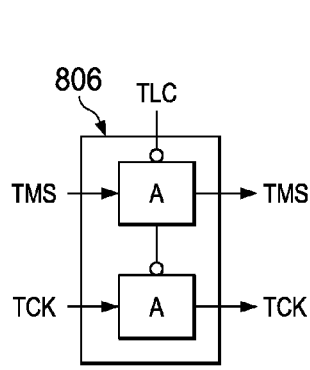

FIGS. 9-11 are provided to illustrate various TMS and TCK gating means that could be incorporated in gating circuit 806 of FIG. 8, by design choice. Other TMS and TCK gating means shown in this disclosure may also incorporate the gating means shown in FIG. 9-11. In other words, any TMS and TCK gating means shown in this disclosure may include: (1) gating TMS and not TCK, (2) Gating both TMS and TCK and (3) gating TCK and not TMS.

Figure 12A:
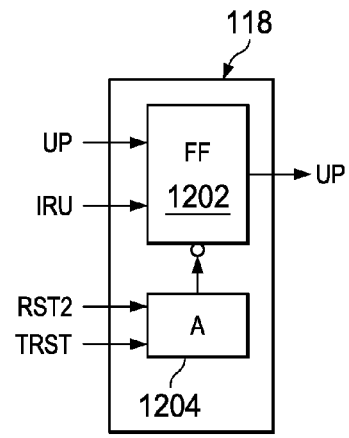
FIG. 12A illustrates an example implementation of the UP Control Unit.

FIG. 12A illustrates one example implementation of the Up Control Unit of FIG. 1, which consists of a FF 1202 and AND gate 1204. Upon an IRU update signal from TAP 114 and if the UP signal from TAP 114 is asserted, the output of FF 120 is asserted, enabling upward access to the die above the FIG. 1 die. After being set, the output of FF can only be reset by a RST2 output from Reset Control Unit 122 or by a TRST input. This implementation assumes the IRU output from TAP 114 is gated by the UP signal from TAP 114 being in the asserted logic state. In other words, if the UP signal from TAP 114 is not asserted, the IRU signal is gated off within the TAP 114 and will not clock FF 1202 to change it state.

Figure 12B:
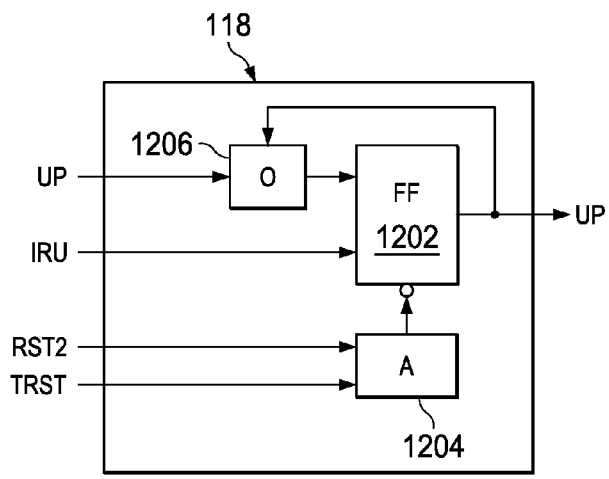
FIG. 12B illustrates an alternate example implementation of the UP Control Unit.

FIG. 12B illustrates another example implementation of the Up Control Unit of FIG. 1, which consists of a FF 1202, Or gate 1206 and AND gate 1204. Upon a IRU update signal from TAP 114 and if the UP signal from TAP 114 is asserted, the output of FF 120 is asserted, enabling upward access to the die above the FIG. 1 die. After being set, the output of FF can only be reset by a RST2 output from Reset Control Unit 122 or by a TRST input. This implementation assumes the IRU output from TAP 114 is not gated by the UP signal from TAP 114 being in the asserted logic state. In other words, the IRU signal occurs during each and every IRU update the TAP 114 goes through. The Or gate 1206 feeds back the output of FF 1204 to the input of FF 1204, therefore maintaining FF in the set or asserted state during each un-gated IRU signal produced by the TAP 114.

Figure 13:
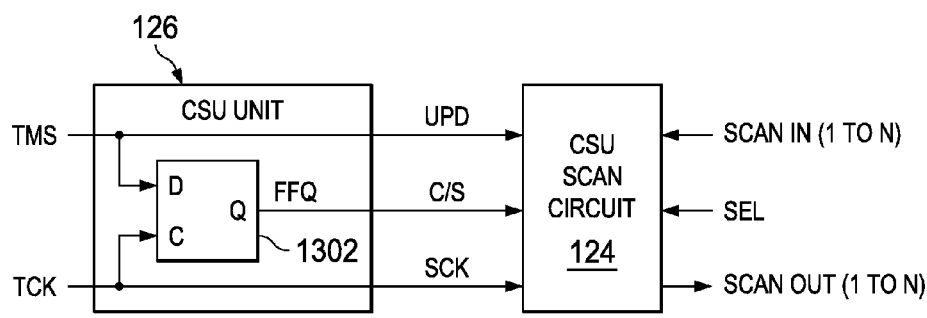
FIG. 13 illustrates an implementation of the CSU Circuit controlling a CSU Scan Circuit.

FIG. 13 illustrates one example implementation of the CSU Unit 126 of FIG. 1 which includes a FF 1302. CSU Unit 126 receives the TMS and TCK signals as shown in FIG. 1. The TMS signal is coupled to the D input of FF 1302 and the TCK signal is coupled to the clock input of FF 1302. Further, the TMS input passes through the CSU Unit 126 to be coupled to the Update (UPD) input of a Capture Shift Update (CSU) scan circuit 124, and the TCK input passes through the CSU Unit 126 to be coupled to the Scan Clock (SCK) input of CSU scan circuit 124. The Q output of FF 1302 is coupled to the Capture or Shift (C/S) input of CSU scan circuit 124.

CSU scan circuit 124 is implemented with scan cells that include Capture, Shift and Update (CSU) elements, which are well known in the art and described in detail in IEEE 1149.1 and earlier in TI patent applications by Whetsel that fostered the concept of CSU scan cell design. The CSU scan circuit 124 also includes 1 to N Scan inputs, a Select (SEL) input, and 1 to N scan outputs. When selected by the SEL input, the CSU scan circuit 124 responds to the UPD, C/S and SCK inputs from the CSU Unit 126 to capture data, shift data from the Scan in to the Scan out and to Update data. The CSU scan circuit may include a single scan path having 1 in and 1 out or it may contain N parallel scan paths having N in and N out.

Figure 14:
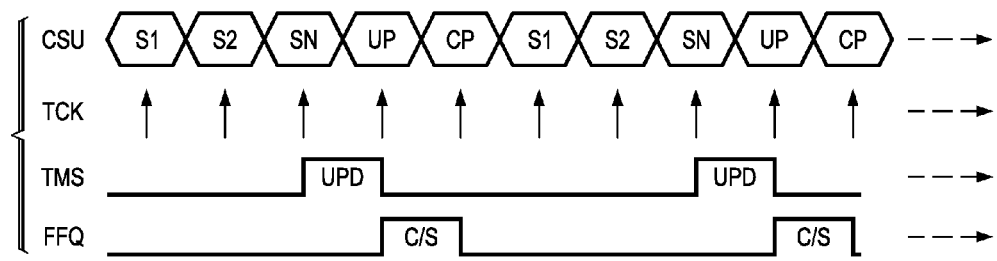
FIG. 14 illustrates a timing example of the operation of the CSU Unit of FIG. 13.

FIG. 14 illustrates a timing diagram of operation of the CSU Unit 126 and CSU scan circuit 124 in response to the UPD, C/S and SCK outputs from CSU Unit 126. The CSU operation of the scan path or paths is indicated by shift operation states (S1-SN), update operation states (UP) and capture operation states (CP), going from left to right. Up going arrows on TCK indicate the timing clocks of SCK. Assertions on TMS indicate times where UPD operations of occur. Assertions on the FFQ output of FF 1302 indicate when capture operations occur. As can be clearly seen, TCK's occurring during S1-SN operations, while the FFQ input is low, shifts data in and output of the CSU Unit 124. When the UPD signal is asserted, an update operation occurs in CSU scan circuit 124. When the FFQ signal is asserted a capture operation occurs in CSU scan circuit 124. This control process of shifting, updating and capturing data cycles over and over during the testing of CSU scan circuit 124.

Figure 15:
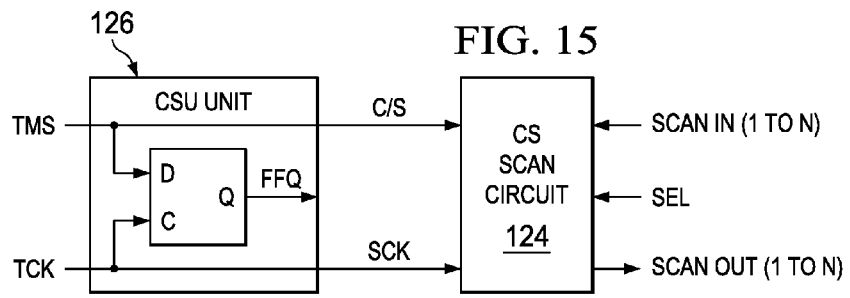
FIG. 15 illustrates an implementation of the CSU Circuit controlling a CS Scan Circuit.

FIG. 15 illustrates one example implementation of the CSU Unit 126 of FIG. 1 which includes a FF 1302. CSU Unit 126 receives the TMS and TCK signals as shown in FIG. 1. The TMS signal is coupled to the D input of FF 1302 and the TCK signal is coupled to the clock input of FF 1302. Further, the TMS input passes through the CSU Unit 126 to be coupled to the C/S input of a Capture Shift (CS) scan circuit 124, and the TCK input passes through the CSU Unit 126 to be coupled to the Scan Clock (SCK) input of CS scan circuit 124.

CS scan circuit 124 is implemented with scan cells that include only Capture and Shift elements, which are well known in the art of simple scan design. The CS scan circuit 124 also includes 1 to N Scan inputs, a Select (SEL) input, and 1 to N scan outputs. When selected by the SEL input, the CS scan circuit 124 responds to the C/S and SCK inputs from the CSU Unit 126 to capture data and shift data from the Scan in to the Scan out and to Update data. The CS scan circuit may include a single scan path having 1 in and 1 out or it may contain multiple parallel scan paths having N in's and N out's.

Figure 16:
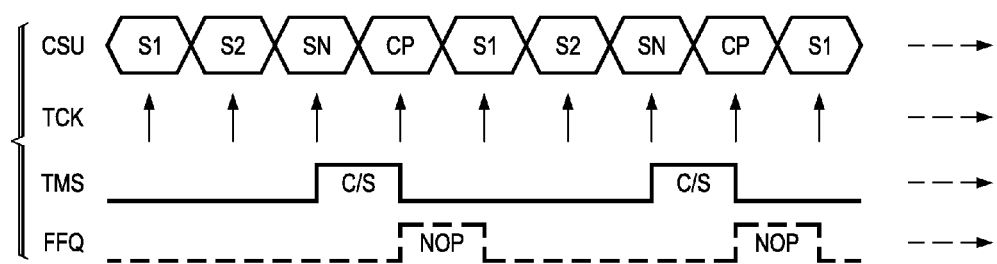
FIG. 16 illustrates a timing example of the operation of the CSU Unit of FIG. 15.

FIG. 16 illustrates a timing diagram of operation of the CSU Unit 126 and CS scan circuit 124 in response to the C/S and SCK outputs from CSU Unit 126. The CS operation of the scan path or paths is indicated by shift operation states (S1-SN) and capture operation states (CP), going from left to right. Up going arrows on TCK indicate the timing clocks of SCK. Assertions on TMS indicate times where capture operations of occur during the scan operations. As can be clearly seen, TCK's occurring during S1-SN operations, while the TMS is low, shifts data in and output of the CS Unit 124. When the TMS signal is asserted, a capture operation occurs in CS scan circuit 124. This control process of shifting and capturing data cycles over and over during the testing of CS scan circuit 124. As seen in FIG. 15 as opposed to FIG. 13, the FFQ output of CSU Unit 126 is not connected to CS scan circuit 124 because CS scan circuit 124 does not have an update element, as does the CSU scan circuit 124 of FIG. 13.

FIG. 17 is provided to illustrate the connection between a CSU Unit 126 and at least one CSU scan circuit 124 and at least one CS scan circuit 124. Thus one CSU Unit 126 can provide scan access to either a CSU scan circuit 124 or a CS scan circuit 124, by the connections that have been previously stated and described in regard to FIGS. 13 and 15. If a CSU scan circuit is to be accessed, its SEL signal will be asserted.

If a CS scan circuit is to be accessed, its SEL signal will be asserted. According to this disclosure, there shall be a plurality of SEL signals issued from TAP 114 to allow selective access to any desired CSU or CS scan circuit 124, as indicated in FIG. 1. In other words, to accommodate access to different CSU or CS scan circuits, the TAP 114 shall provide a unique SEL signal output to each of the CSU or CS scan circuits, such that any one of them may be individually selected to respond to the control signals output from the CSU Unit 126. The SEL signals may come from an instruction register associated with TAP 114 or from a data register associated with TAP 114, by design choice of TAP 114.

It is important at this point of the disclosure to mention that when the TMS and TCK signals from surface 128 are being used to control CSU or CU scan circuits, that the TAP Lock Unit 116 of FIG. 1 shall be set to disable the TMS and TCK signals from modifying the current state of the state machine of TAP 114 until such time as when the TAP Lock Unit 116 is reset from isolating the TAP 114 from the TMS and TCK signals, in response to the RST2 signal output from Reset Control Unit 122. The TAP state machine is a 16 state machine that is well known in the art of testing and defined in IEEE 1149.1 and other IEEE test standards. The IEEE 1149.1 standard is hereby incorporated in its entirety as a reference in this disclosure. The ability to lock the TAP 114 from responding to TMS and TCK signals allows these signals to be modified to where they are able to input a control protocol to the CSU Unit 126 to execute scan CSU and CS operations on the selected Scan Circuit 124. In other words, the disclosure provides a means, via the TAP Lock Unit 116, to allow the TMS and TCK signals to be re-used, as necessary, to perform other types of test and other operations instead of being dedicated to only operating the TAP 114.

This disclosure anticipates various scan design techniques being used in the implementation of Scan Circuit 124. For illustrative and claiming purposes, FIGS. 18-26 depict some, but not all, of the various scan design techniques that may be used to implement Scan Circuit 124, according to this disclosure. The freedom of the type of Scan Circuit 124 implementation is left to the user of this disclosure.

FIG. 18 illustrates the Scan Circuit 124 being realized as a CS parallel scan circuit controlled by SCK, C/S and SEL inputs and receiving parallel scan inputs (SI) from PTI bus 102 and outputting parallel scan outputs (SO) on bus 146 to either the PTO bus 106 or to PTO bus 108. The scan paths 1802 of this type of Scan Circuit does not include Update stages, so the UPD signal is not required.

FIG. 19 illustrates the Scan Circuit 124 being realized as a CSU parallel scan circuit controlled by SCK, C/S, UPD and SEL inputs and receiving parallel scan inputs (SI) from PTI bus 102 and outputting parallel scan outputs (SO) on bus 146 to either the PTO bus 106 or to PTO bus 108. The scan paths 1902 of this type of Scan Circuit does include Update stages, so the UPD signal is required.

Figure 20:
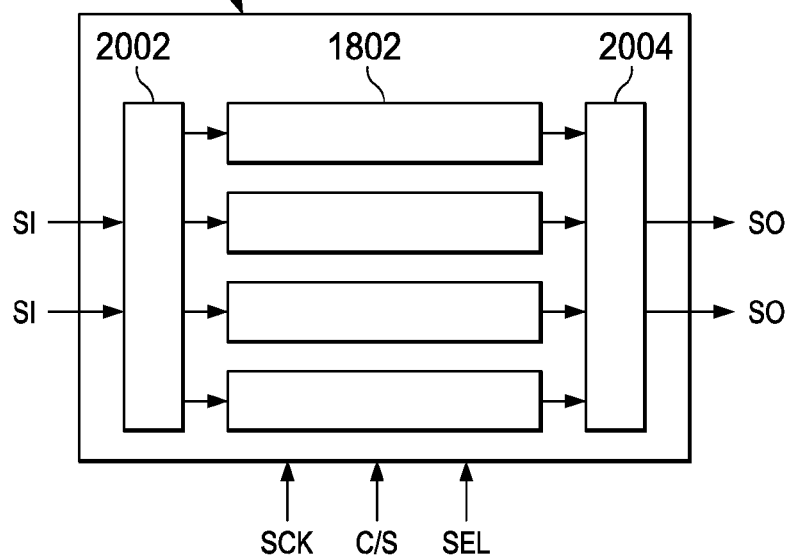
FIG. 20 illustrates a CS Test Compression Circuit.

FIG. 20 illustrates the Scan Circuit 124 being realized as a CS test compression parallel scan circuit controlled by SCK, C/S and SEL inputs and receiving parallel scan inputs (SI) from a Decompressor 2002 from compressed SI from PTI bus 102 and outputting parallel scan outputs (SO) to a Decompressor 2004 which compresses them and outputs them on bus 146 to either the PTO bus 106 or to PTO bus 108. This type of Scan Circuit does not include Update stages, so the UPD signal is not required.

Figure 21:
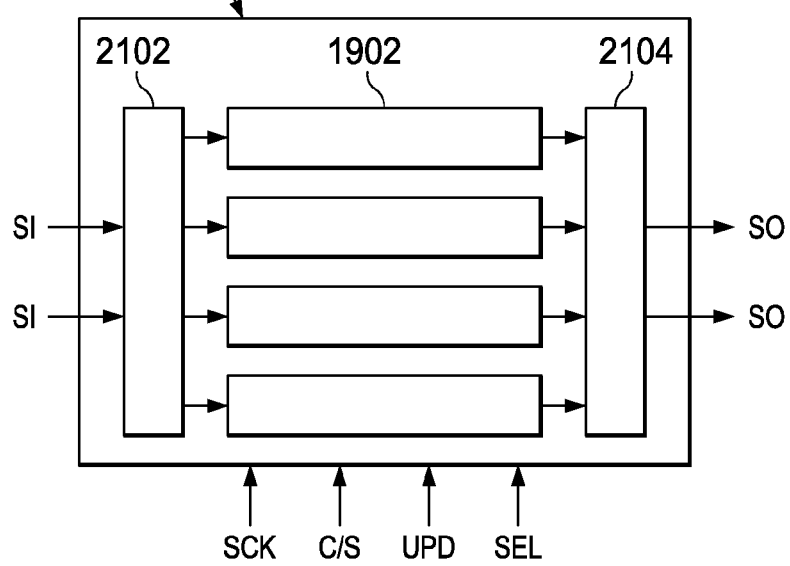
FIG. 21 illustrates a CSU Test Compression Circuit.

FIG. 21 illustrates the Scan Circuit 124 being realized as a CS test compression parallel scan circuit controlled by SCK, C/S, UPD and SEL inputs and receiving parallel scan inputs (SI) from a Decompressor 2102 from compressed SI from PTI bus 102 and outputting parallel scan outputs (SO) to a Decompressor 2104 which compresses them and outputs them on bus 146 to either the PTO bus 106 or to PTO bus 108. This type of Scan Circuit does include Update stages, so the UPD signal is required.

Figure 22:
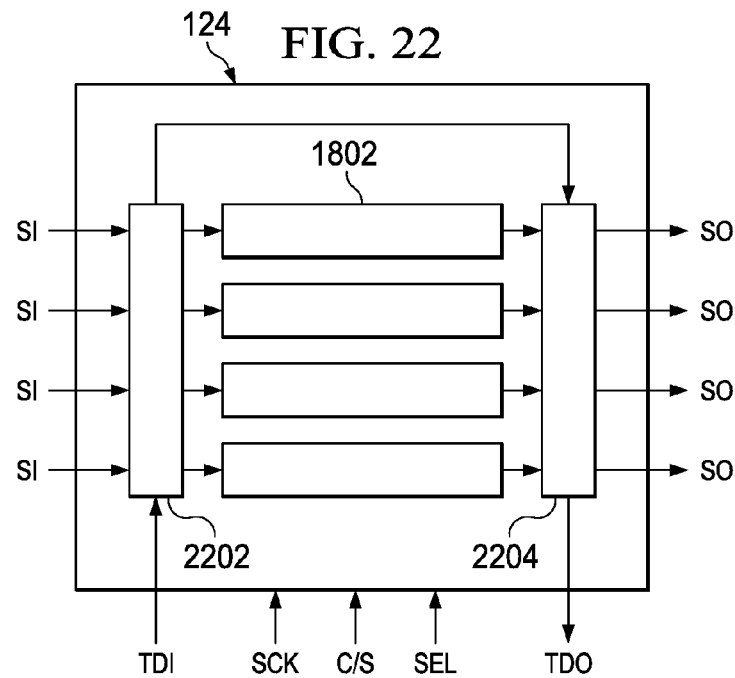
FIG. 22 illustrates a CS Core Wrapper Circuit.

FIG. 22 illustrates the Scan Circuit 124 being realized as a Core Wrapper, for example a Core Wrapper as defined in IEEE 1500, incorporated herein by reference, controlled by SCK, C/S and SEL inputs and receiving parallel scan inputs (SI) from PTI bus 102 or serial inputs from TDI via core boundary scan register 2202, and outputting parallel scan outputs (SO) on bus 146 to either the PTO bus 106 or to PTO bus 108 or outputting serial outputs on TDO via core boundary scan register 2202. The scan paths 1802 of this type of Scan Circuit does not include Update stages, so the UPD signal is not required. The core boundary scan paths 2202 and 2204 are assumed to be CS types and so also do not include Update stages or the need or the UPD signal.

Figure 23:
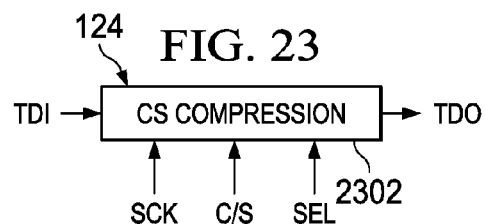
FIGS. 23-25 illustrate examples of different types of CS circuits that may be accessed via TDI and TDO.

FIG. 23 illustrates a serial path between TDI and TDO whereby access to a CS Test Compression circuit 2302, included in the CS Core Wrapper 124 of FIG. 22, may be provided. The CS Test Compression circuit 2302 of FIG. 23 includes at least parts of core boundary scan register 2202, scan registers 1802 and core boundary scan register 2204 of FIG. 22.

Figure 24:
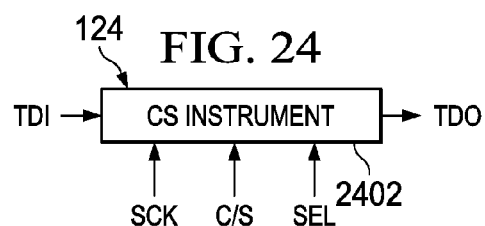

FIG. 24 illustrates a serial path between TDI and TDO whereby access to a CS instrument circuit 2402, included in the CS Core Wrapper 124 of FIG. 22, may be provided. The CS Instrument circuit 2402 of FIG. 24 includes at least parts of core boundary scan register 2202, scan registers 1802 and core boundary scan register 2204 of FIG. 22.

Figure 25:
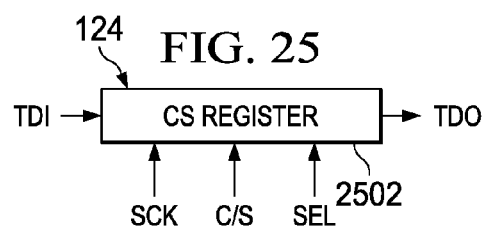

FIG. 25 illustrates a serial path between TDI and TDO whereby access to a CS Register circuit 2502, included in the CS Core Wrapper 124 of FIG. 22, may be provided. The CS Register circuit 2502 of FIG. 25 includes at least parts of core boundary scan register 2202, scan registers 1802 and core boundary scan register 2204 of FIG. 22.

Figure 26:
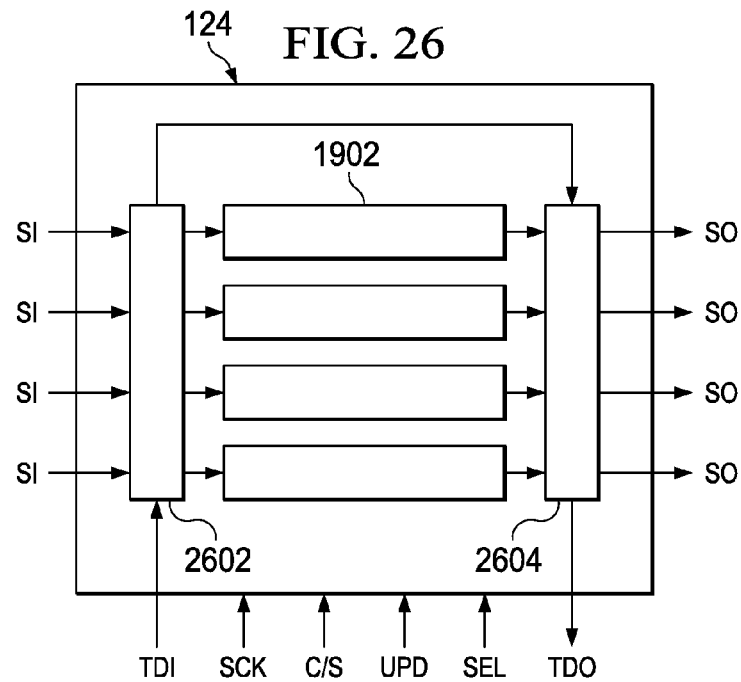
FIG. 26 illustrates a CSU Core Wrapper Circuit.

FIG. 26 illustrates the Scan Circuit 124 being realized as a Core Wrapper, for example a Core Wrapper as defined in IEEE 1500, controlled by SCK, C/S, UPD and SEL inputs and receiving parallel scan inputs (SI) from PTI bus 102 or serial inputs from TDI via core boundary scan register 2602, and outputting parallel scan outputs (SO) on bus 146 to either the PTO bus 106 or to PTO bus 108 or outputting serial outputs on TDO via core boundary scan register 2602. The scan paths 1902 of this type of Scan Circuit does include Update stages, so the UPD signal is required. The core boundary scan paths 2602 and 2604 are assumed to be CSU types, and will include Update stages and thus need the UPD signal. However, according to this disclosure and by design choice, core boundary scan paths 2602 and 2604 may also be without Update stages, like core boundary scan paths 2202 and 2204 of FIG. 22, and not require a connection to the UPD signal if so desired.

Figure 27:
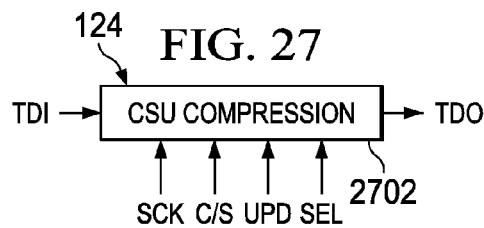
FIGS. 27-29 illustrate examples of different types of CSU circuits that may be accessed via TDI and TDO.

FIG. 27 illustrates a serial path between TDI and TDO whereby access to a CSU Test Compression circuit 2702, included in the CSU Core Wrapper 124 of FIG. 26, may be provided. The CSU Test Compression circuit 2702 of FIG. 27 includes at least parts of core boundary scan register 2602, scan registers 1902 and core boundary scan register 2604 of FIG. 26.

Figure 28:
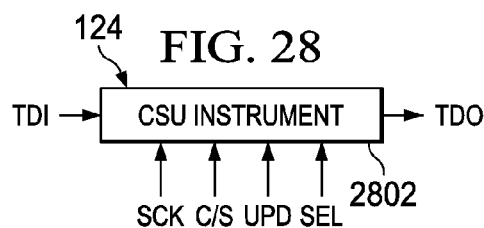

FIG. 28 illustrates a serial path between TDI and TDO whereby access to a CSU Instrument circuit 2802, included in the CSU Core Wrapper 124 of FIG. 26, may be provided. The CSU Instrumentation circuit 2802 of FIG. 28 includes at least parts of core boundary scan register 2602, scan registers 1902 and core boundary scan register 2604 of FIG. 26.

Figure 29:
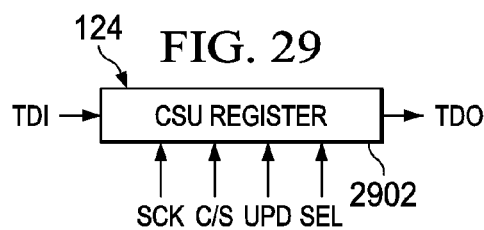

FIG. 29 illustrates a serial path between TDI and TDO whereby access to a CSU Register circuit 2902, included in the CSU Core Wrapper 124 of FIG. 26, may be provided. The CSU Register circuit 2902 of FIG. 29 includes at least parts of core boundary scan register 2602, scan registers 1902 and core boundary scan register 2604 of FIG. 26.

Figure 30:
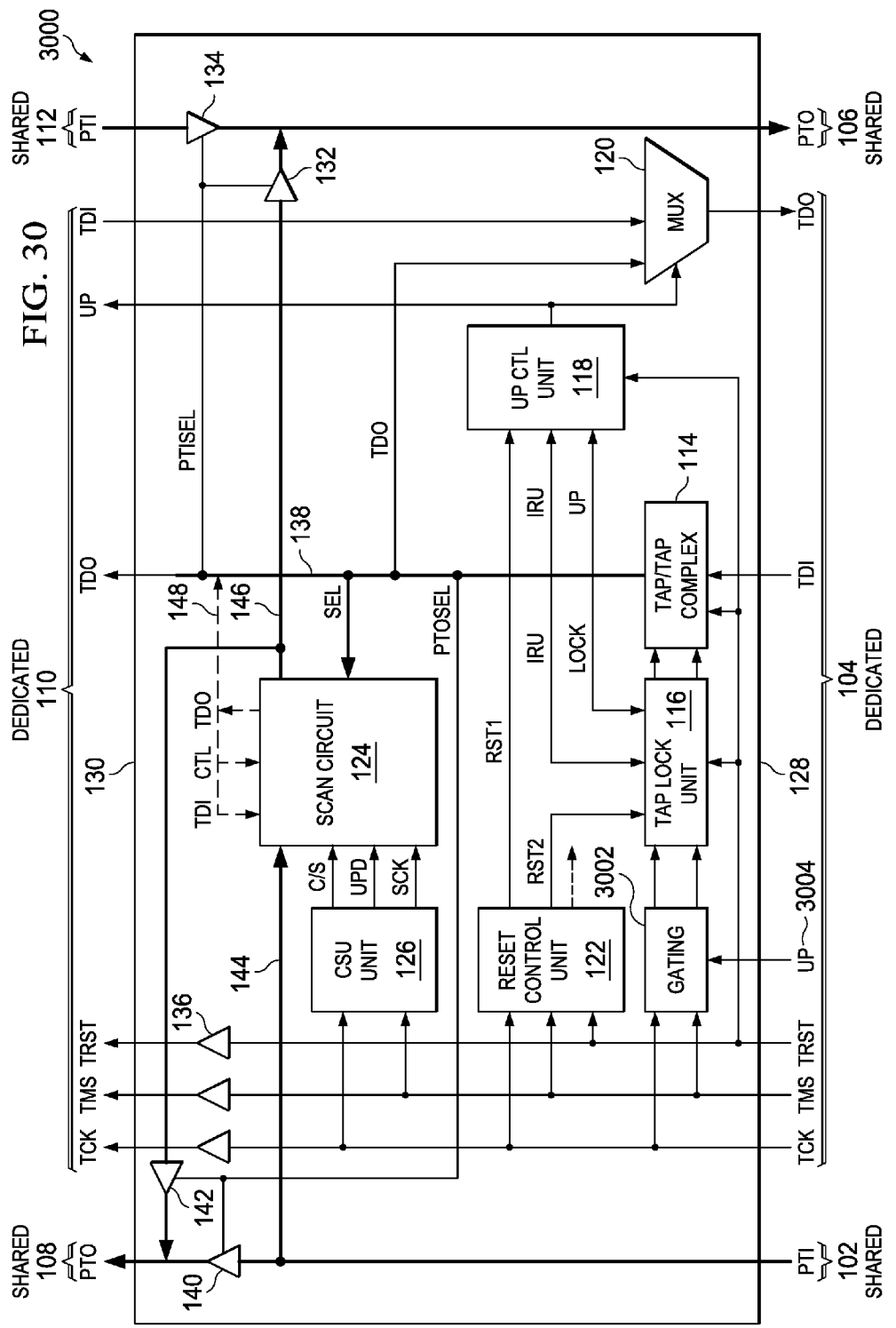
FIG. 30 illustrates a middle die in a stack containing the test architecture of the disclosure.

FIG. 30 illustrates a die 3000 including the test architecture of a middle die in a stack, according to the disclosure. Die 3000 includes a bottom surface 128 and a top surface 130, like die 100 of FIG. 1. The bottom surface 128 of die 3000 will be connected to the top surface 130 of a first (bottom) die 100 during assembly. The top surface 130 of die 3000 will be connected to either the bottom surface 128 of another middle die 3000 or to the bottom surface 128 of a last die in the stack, which will described in regard to FIG. 32. The construction and operation of the test architecture of the Middle die 3002 is exactly the same as first die 100 with the following exceptions.

(1) The dedicated signals 104 on bottom surface 128 further include an UP input signal 3004 to allow connecting to the UP output signal 110 on the surface 130 of first die 100.
(2) A gating circuit 3002 has been inserted between the TMS and TCK signals 104 of surface 128 and the TMS and TCK inputs to TAP Lock Unit 116. The gating circuit selectively gates on or off the TMS and TCK signals to TAP Lock Unit 116 in response to a control input to gating circuit 3002.
(3) A connection is formed between the UP input signal 3004 of surface 128 and the control input to gating circuit 3002 to control the operation of gating circuit 3002.

Figure 31:
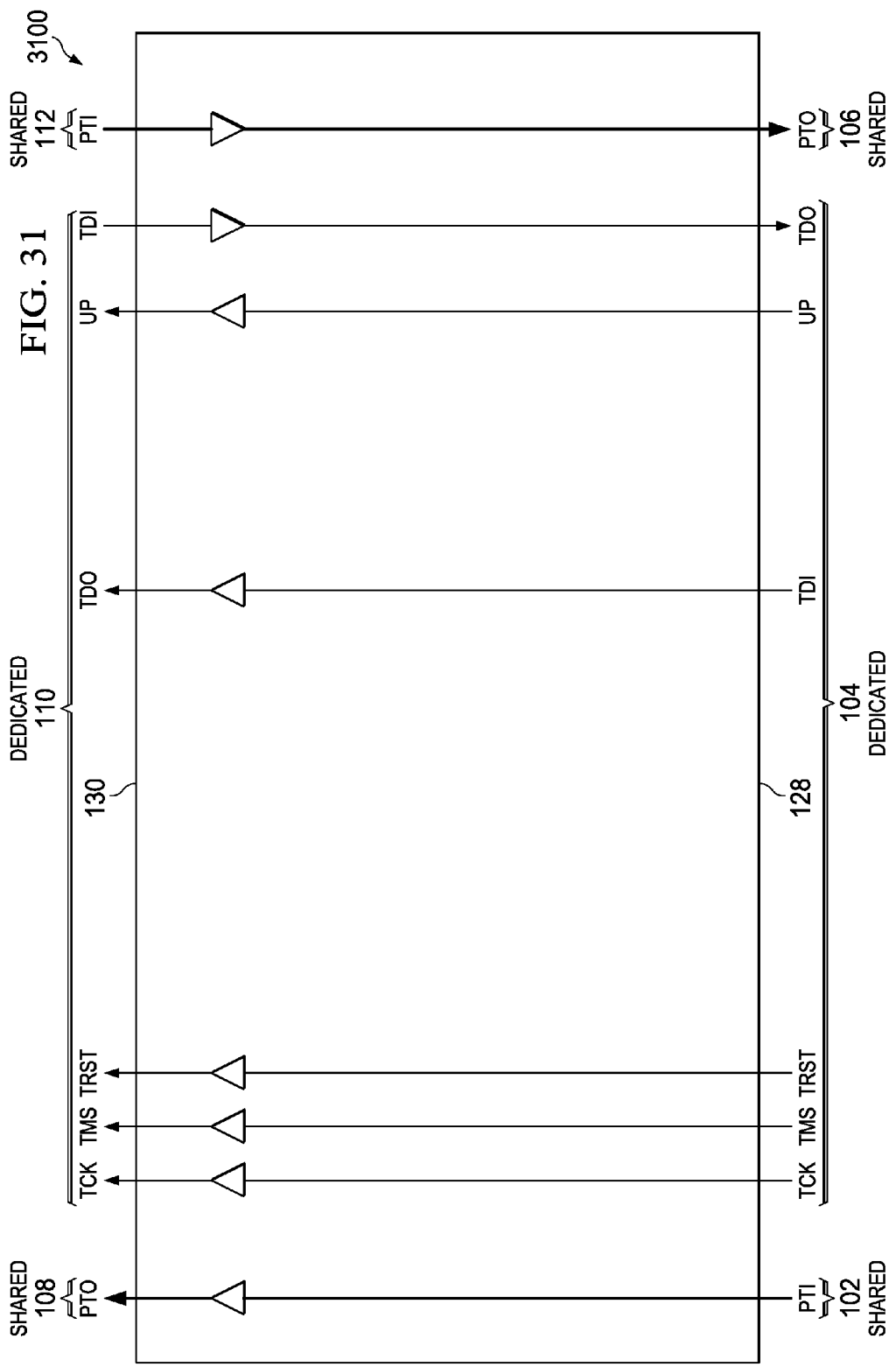
FIG. 31 illustrates a middle die in a stack that does not contain a test architecture but does contain connects from the bottom surface to the top surface for test signals required by the disclosure.

FIG. 31 illustrates a die 3100 including the test architecture of a middle die in a stack, according to the disclosure. Die 3000 includes a bottom surface 128 and a top surface 130, like die 3000 of FIG. 30. However, die 3100 does not need test access. Therefore the test signals 102, 104 and 106 of surface 128 simply pass through die 3100 to the test signals 108, 110 and 112 of surface 130. Die 3100 may be an interposer or a simply a die that does not require test access. The concept of such a die is not novel in itself. However what is novel is the specific test signals defined at the bottom surface 128 (shared signals 102, dedicated signals 104 and shared signals 106) and the test signals defined at the top surface 130 (shared signals 108, dedicated signals 110 and shared signals 112). The die 3100 serves as a middle die in the stack to pass test signals between its bottom surface 128 and top surface 130.

Figure 32:
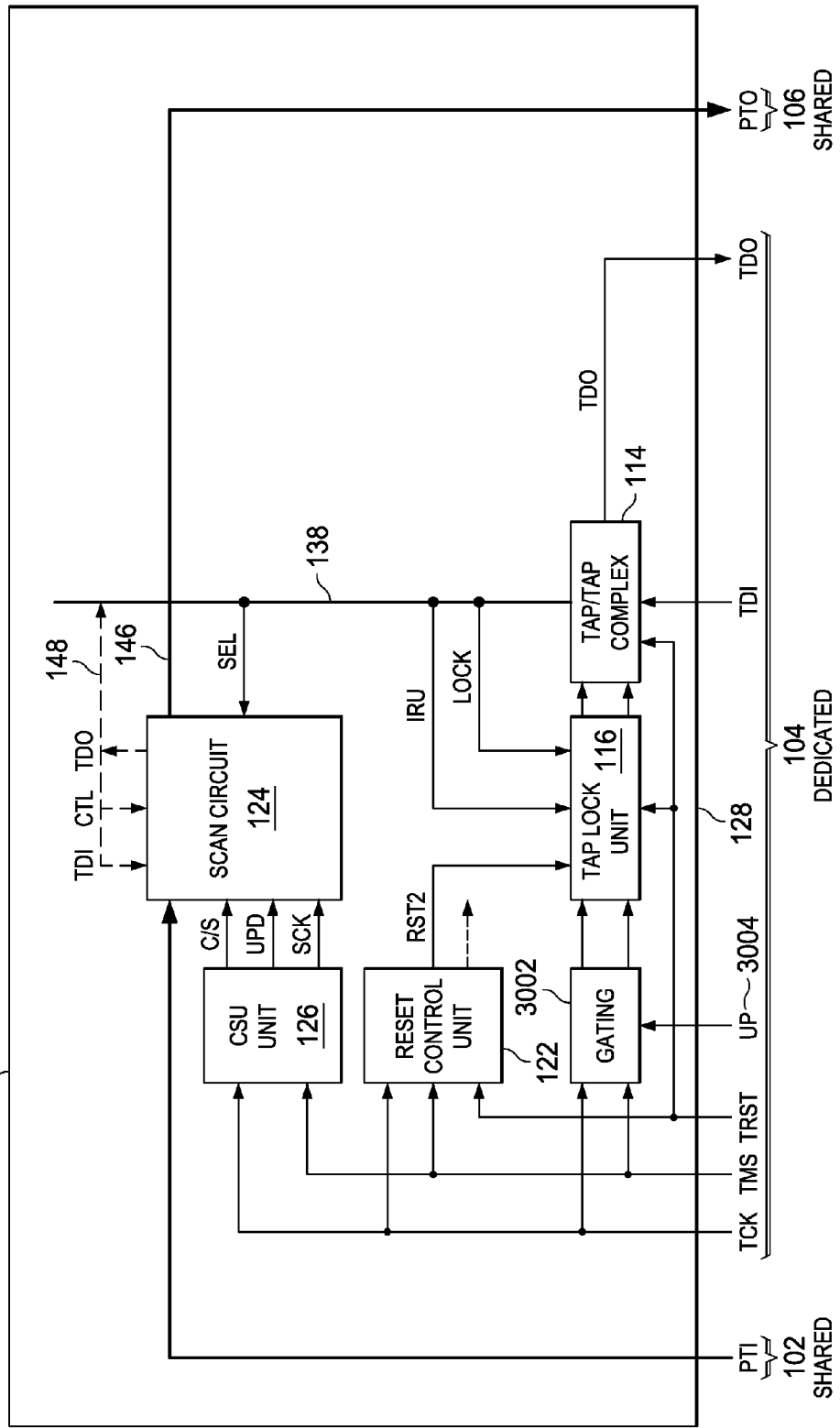
FIG. 32 illustrates a last die in a stack containing the test architecture of the disclosure.

FIG. 32 illustrates a die 3200 including the test architecture of a last die in a stack (i.e. the top die), according to the disclosure. Die 3200 includes a bottom surface 128 with test signals 102, 104 and 106. As seen, an UP input signal 3004 is included in dedicated signal group 104. The bottom surface 128 of die 3200 will be connected to the top surface 130 of a either: (1) a first die 100 when no middle die 3000 are included in a stack or (2) the "last/final" middle die 3000 included in the stack, during final stack assembly. The top surface 130 of die 3200 is absent of test signals, since no further die will exist above the last die 3200 in the stack. The construction and operation of the test architecture of the last die 3200 is exactly the same as middle die 3000 with the following exceptions.
(1) Multiplexer 120 is not implemented and TDO from TAP 114 is connected directly to the TDO signal 104 of surface 128.
(2) UP CTL Unit 118 is not implemented since no UP signal is required to be generated by the last die.
(3) Buffers 140 and 142 are not implemented since no PTO signals 108 are present on the surface 130 of the last die.
(4) Buffers 132 and 134 are not implemented since no PTI signals 112 are present on the surface 130 of the last die.
(5) The RST1 output of Reset Control Unit 122 is not required since there is no Up CTL Unit 118 in the last die.
(6) PTOSEL, PTISEL, and UP signals are not required on Control Bus 138 from TAP 114 since buffers 132, 134, 140, 142 and Up CTL Unit 118 are not implemented.

Figure 33:
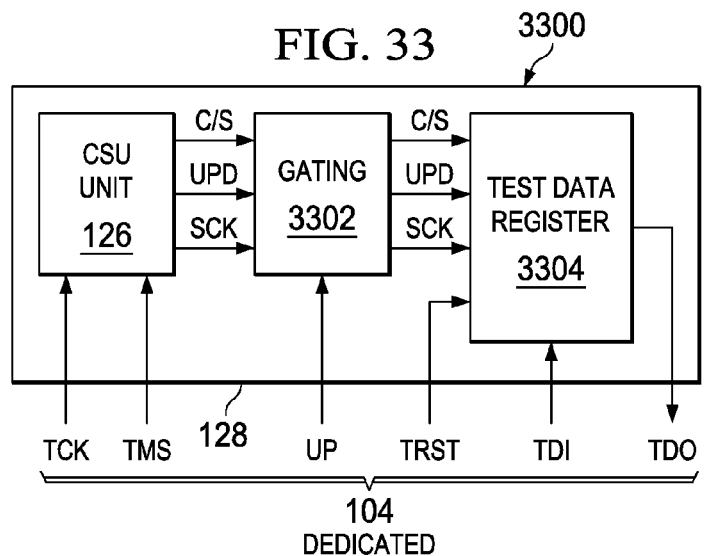
FIG. 33 illustrates a last die in a stack containing an alternate test architecture of the disclosure.

FIG. 33 is provided to illustrate that a last die 3300 may only include a Test Data Register 3304 in its architecture, i.e. no TAP 114. Test Data Register 3304 has a TDI input, TDO output and control inputs to operate circuits located between the TDI input and the TDO output. Test Data Register 3304 may be one of many types of serial register circuits, including but not limited to, embedded instrument circuits, scan compression circuits, debug circuits, trace circuits, diagnostic circuits, tuning circuits, boundary scan circuits, built in test circuits, programming circuits and memory repair circuits.

Figure 34:
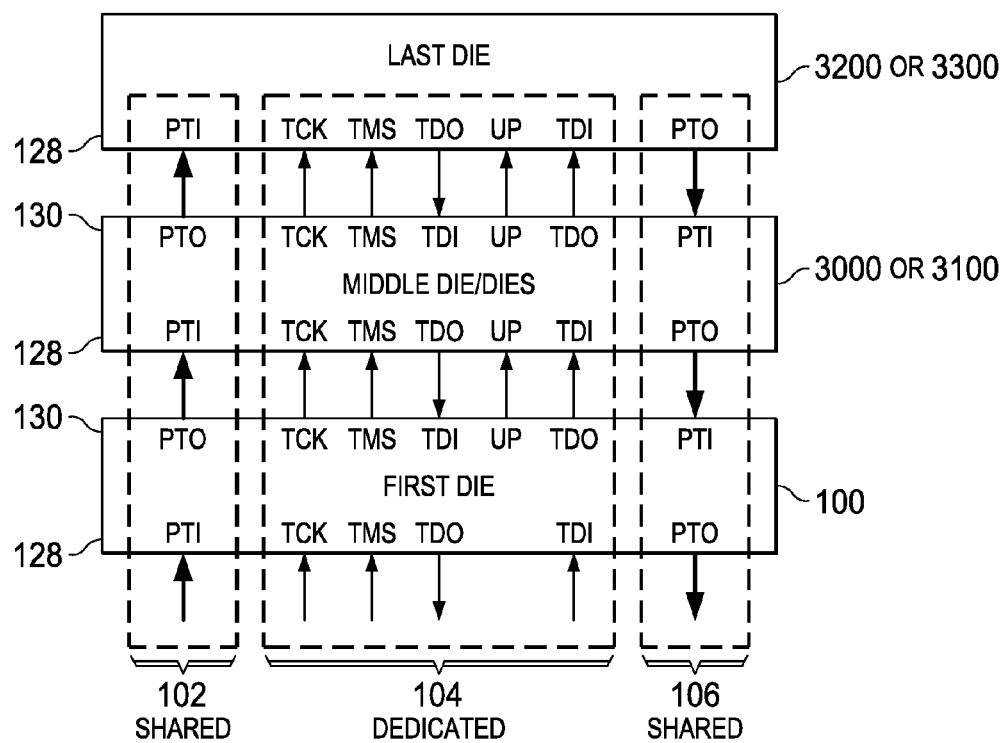
FIG. 34 illustrates a stack of first, middle and last die containing test signaling of the disclosure.

FIG. 34 illustrates an example of a completed stack of die according to the disclosure. For simplification, the TRST signal is not shown in the Figure, but it exists as depicted in previous Figures. The stack includes a first die 100, one or more middle die 3000 or 3100 and a last die 3200 or 3300. The following describes the different modes of testing the stack of die in FIG. 34 according to the teachings of the disclosure. To simplify the description, it will be assumed there is only one middle die between the first die and last die. Also the one middle die is a middle die 3000 as described in FIG. 30 and the last die is a last die 3200 as described in FIG. 32.

If testing of only the first die 100 is necessary, the UP output on surface 130 of the first die 100 is not asserted. Testing of the first die may be performed via TDI to TDO or by PTI to PTO data transmission. Control of the testing is provided by the TMS and TCK signals. TMS and TCK control may be according to IEEE standard 1149.1 or it may be provided by the alternate TMS and TCK control described in this disclosure using the CSU Unit 126 in combination with the TAP Lock Unit 116.

If testing of only the first die 100 and the middle die 3000 is necessary, the UP output on surface 130 of the first die 100 is asserted to enable the middle die 3000 for testing. Testing of the first and middle die may be performed via TDI to TDO or by PTI to PTO data transmission. Control of the testing is provided by the TMS and TCK signals. TMS and TCK control may be according to IEEE standard 1149.1 or it may be provided by the alternate TMS and TCK control described in this disclosure using the CSU Unit 126 in combination with the TAP Lock Unit 116.

If testing of the first die 100, the middle die 3000 and the last die 3200 is necessary, the UP output on surface 130 of the first die 100 is asserted to enable the middle die 3000 for testing. Then the UP output on surface 130 of the middle die 3000 is asserted to enable the last die 3200 for testing. Testing of the first, middle and last die may be performed via TDI to TDO or by PTI to PTO data transmission. Control of the testing is provided by the TMS and TCK signals. TMS and TCK control may be according to IEEE standard 1149.1 or it may be provided by the alternate TMS and TCK control described in this disclosure using the CSU Unit 126 in combination with the TAP Lock Unit 116.

Figure 35:
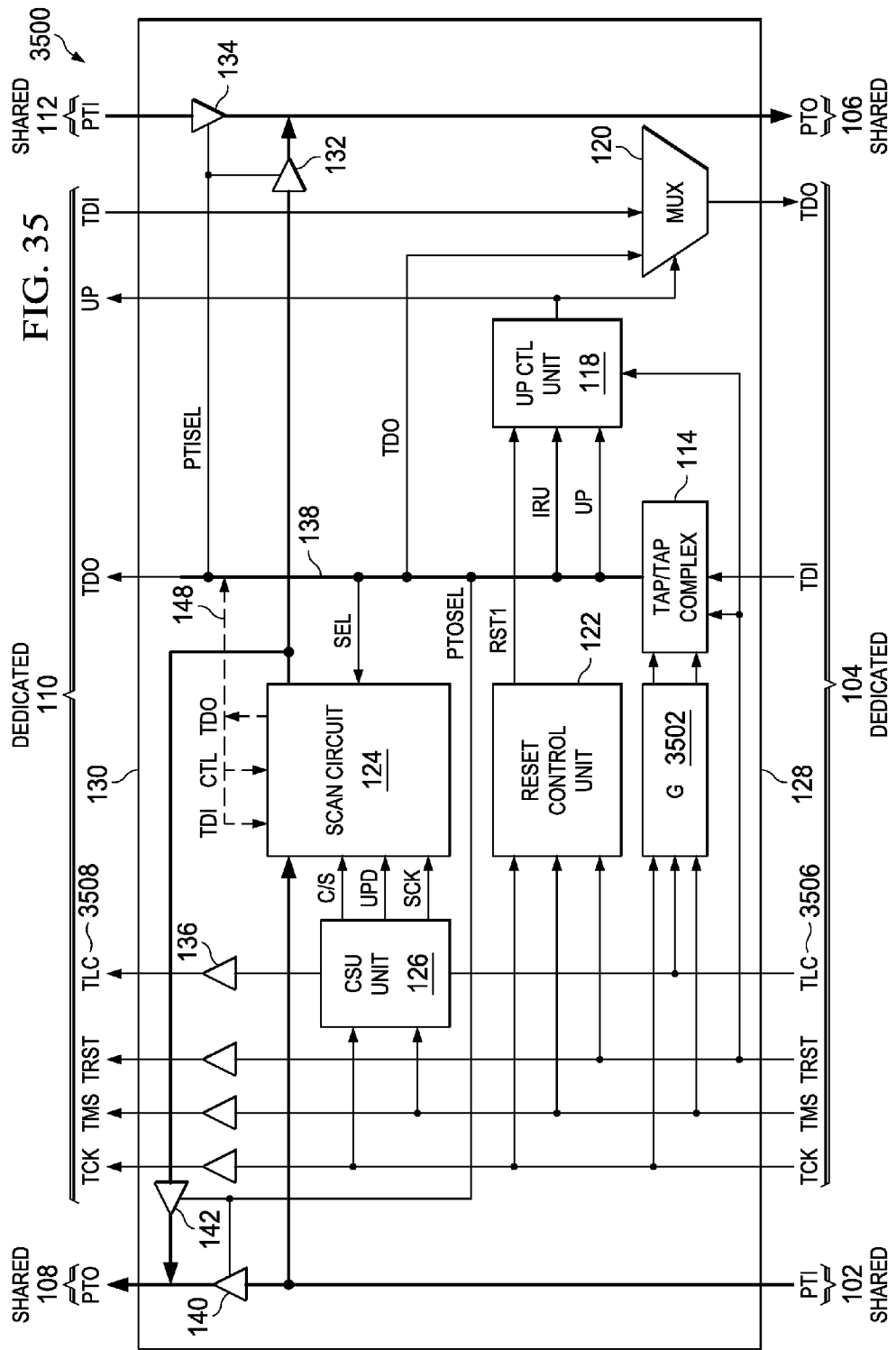
FIG. 35 illustrates an alternate test architecture of a first die in a stack.

FIG. 35 illustrates an alternate test architecture of the FIG. 1 test architecture for a first die in a die stack, according to the invention. The first die architecture 3500 of FIG. 35 is identical to the architecture of the first die architecture 100 of FIG. 1 with the following exceptions.
(1) The TAP Lock Unit 116 of FIG. 1 has been replaced with a TMS and TCK gating means 3502 in FIG. 35 with a control input.

(2) A TAP Lock Control (TLC) input signal 3506 has been added to the dedicated test signals 104 of surface 128 and is connected to the control input of the gating means 3502.
(3) The RST2 output of the Reset Control Unit 122 is removed since there is no TAP Lock Unit 116 to reset.
(4) The TCL 3506 input signal of surface 128 passes up to a TLC 3508 output signal on surface 130.

Figure 36:
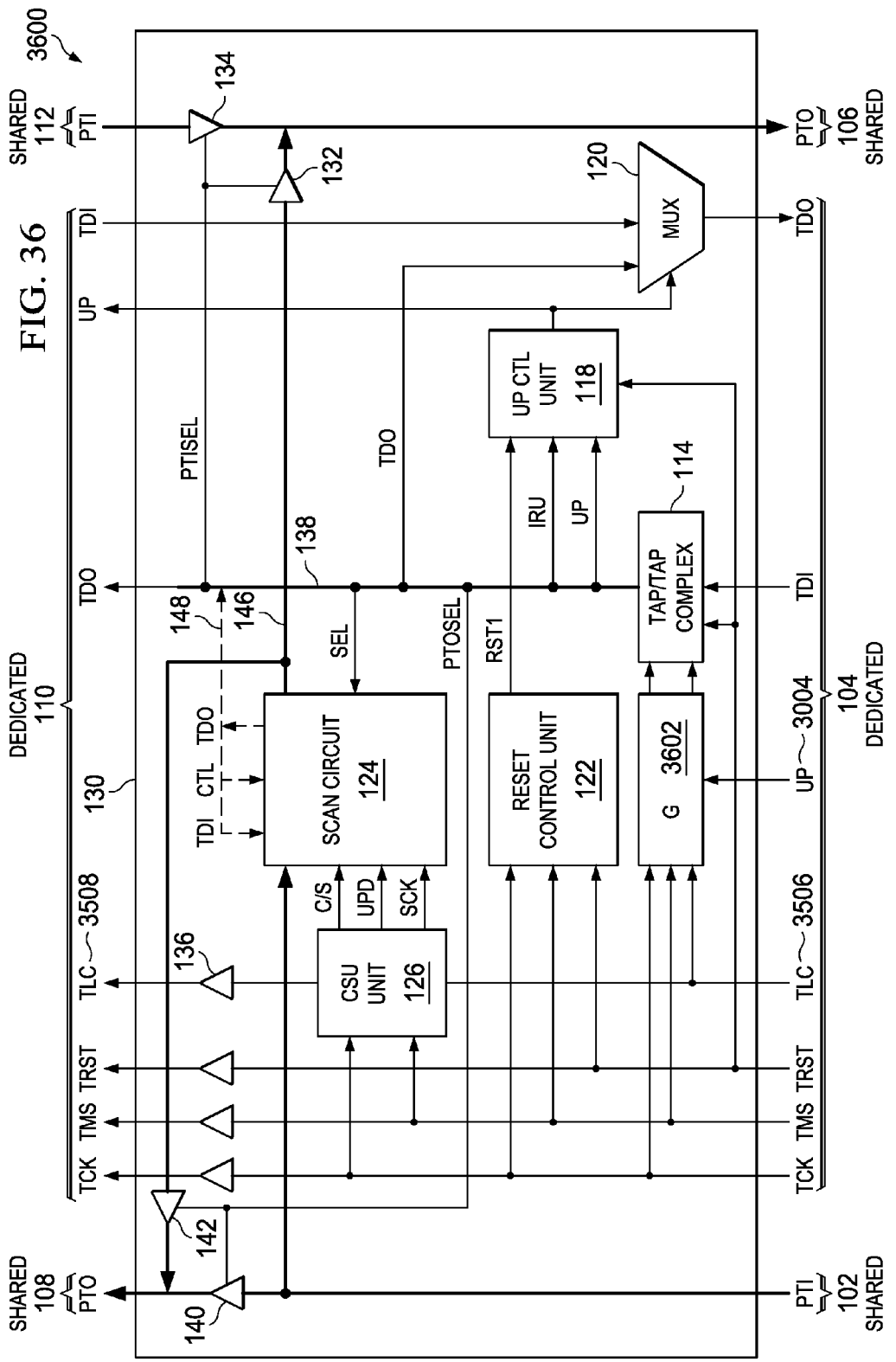
FIG. 36 illustrates an alternate test architecture of a middle die in a stack.

FIG. 36 illustrates an alternate test architecture of the FIG. 30 test architecture for a middle die in a die stack, according to the invention. The middle die architecture 3600 of FIG. 36 is identical to the architecture of the middle die architecture 3000 of FIG. 30 with the following exceptions.
(1) The TAP Lock Unit 116 and gating means 3002 of FIG. 30 has been replaced with a TMS and TCK gating means 3602 in FIG. 36 with two control inputs.
(2) A TAP Lock Control (TLC) input signal 3506 has been added to the dedicated test signals 104 of surface 128 and is connected to a first control input of the gating means 3502 and the UP control input 3004 input of 104 is connected to a second control input of the gating means 3502.
(3) The RST2 output of the Reset Control Unit 122 is removed since there is no TAP Lock Unit 116 to reset.
(4) The TCL 3506 input signal of surface 128 passes up to a TLC 3508 output signal on surface 130.

Figure 37:
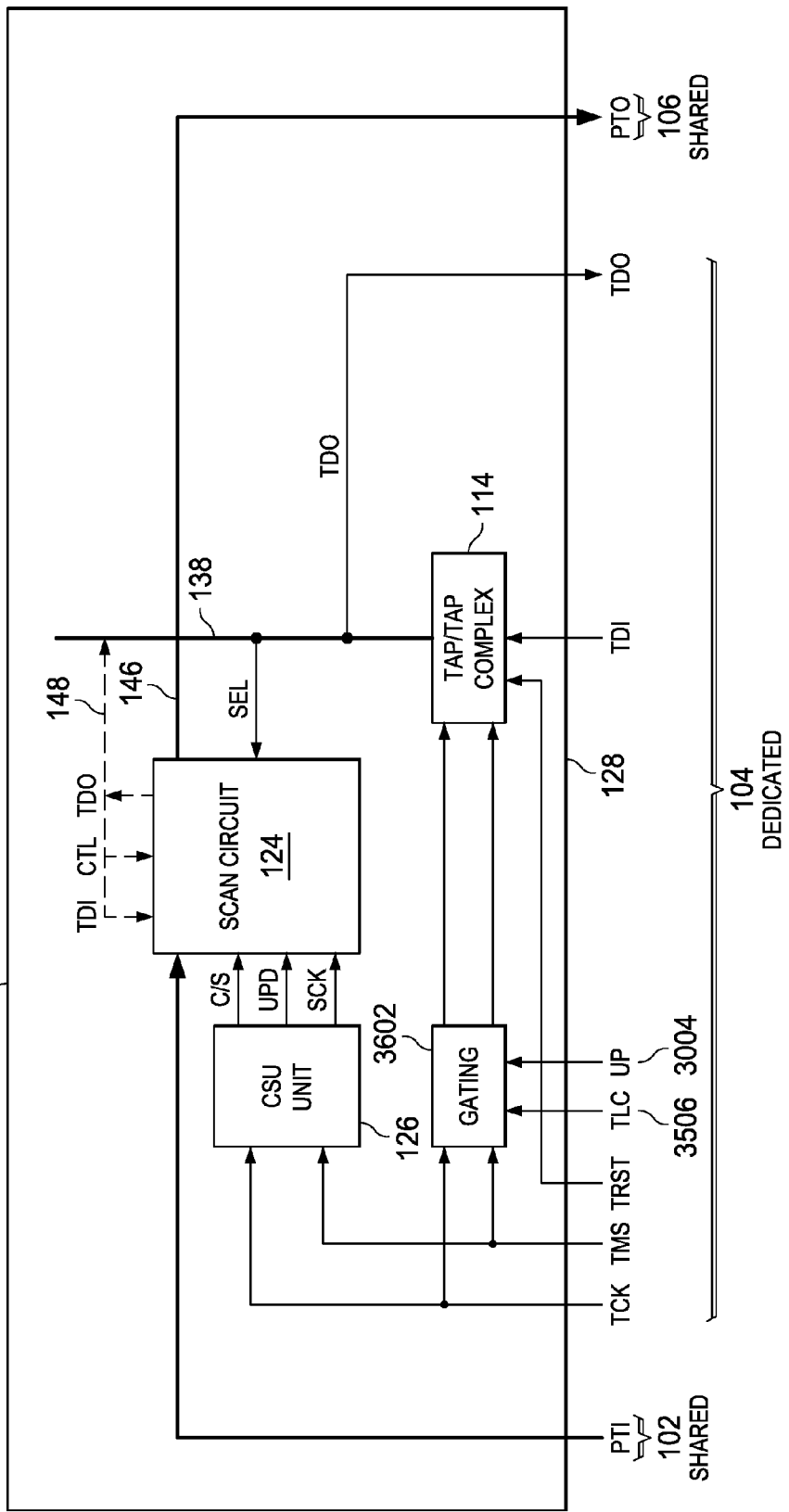
FIG. 37 illustrate an alternate test architecture of a last die in a stack.

FIG. 37 illustrates an alternate test architecture of the FIG. 32 test architecture for a last die in a die stack, according to the invention. The last die architecture 3700 of FIG. 37 is identical to the architecture of the last die architecture 3200 of FIG. 32 with the following exceptions.
(1) Gating means 3002 of FIG. 32 has been replaced with gating means 3602 of FIG. 37, which includes control inputs for both the TLC and UP control input signals from surface 128.
(2) The TAP Lock Unit 116 of FIG. 32 has been removed to allow the TMS and TCK outputs of gating means 3602 to be directly connected to TMS and TCK inputs of TAP 114.
(3) The Reset Control Unit 122 of FIG. 32 has been removed since it is not necessary in the architecture of FIG. 37, which does not include the TAP Lock Unit 116 of FIG. 32.

FIGS. 38-40 are provided to illustrate various implementations of gating means 3602. The similarities between gating means 3602 of FIGS. 38-40 and gating means 806 of FIGS. 9-11 are clearly evident in there intention of gating TMS, gating TCK or gating both TMS and TCK.

FIG. 41 illustrates how a CSU Scan Circuit 124 may be selectively controlled by either the CSU Unit 126 or by the Chip TAP 202 of TAP 114 of FIG. 2 of the disclosure. As seen, a Mux 4102 has been inserted in the SCK, C/S and UPD control path to CSU Scan Circuit 124. The Mux has a first input port for the SCK, C/S and UPD signals from CSU Unit 126, a second input port for the SCK, C/S and UPD signals from Chip TAP 202, an output port of SCK, C/S and UPD signals to CSU Scan Circuit 124 and a Mux Control (MC) input 4104 from Chip TAP 202. If the Chip TAP is set to allow the CSU Unit 126 to control the CSU Scan Circuit 124, the MC signal 4104 from Chip TAP will be set to couple the CSU Unit's SCK, C/S and UPD signals to the SCK, C/S and UPD control inputs of the CSU Scan Circuit 114. In this mode the CSU Unit 126 will control the CSU Scan Circuit as has been described in this disclosure in regard to FIGS. 13 and 14. However If the Chip TAP is set to allow the Chip TAP to control the CSU Scan Circuit 124, the MC signal 4104 from Chip TAP 202 will be set to couple the Chip TAP's SCK, C/S and UPD signals to the SCK, C/S and UPD control inputs of the CSU Scan Circuit 124. If the Chip TAP is set to control the CSU Scan Circuit 124, it will control the CSU Scan Circuit as shown in the timing diagrams of FIG. 42.

In FIG. 42, there are two timing diagrams, 4202 and 4204. Timing diagram 4202 illustrates the states of the Chip TAP 202 when the Chip TAP is controlling the SCK, C/S and UPD inputs to CSU Scan Circuit 124. These Chip TAP states are well known and are part of the 16 states the TAP operates in, according to the referenced IEEE standard 1149.1. Timing diagram 4204 illustrates the control operations that take place during the TAP state sequence in timing diagram 4202, as described below.
(1) When the Chip TAP is in the ShiftDR state of diagram 4202, the C/S input from the Chip TAP is set to cause a Shift operation to occur in CSU Scan Circuit 124, as seen in diagram 4204.
(2) When the Chip TAP is in the Exit1DR state of diagram 4202, a No-Operation (NOP) occurs in CSU Scan Circuit 124, as seen in diagram 4204.
(3) When the Chip TAP is in the UpdateDR state of diagram 4202, the UPD input from the Chip TAP is set to cause an Update operation to occur in CSU Scan Circuit 124 as seen in diagram 4204.
(4) When the Chip TAP is in the SelectDR state of diagram 4202, a NOP occurs in CSU Scan Unit 124, as seen in diagram 4204.
(5) When the Chip TAP is in the CaptureDR state of diagram 4202, the C/S input from the Chip TAP is set to cause a Capture operation to occur in CSU Scan Circuit 124, as seen in diagram 4204.

During either type of CSU control, regardless whether the CSU control comes from the Chip TAP 202 or the CSU Unit 126, the CSU Scan Circuit 124 may be operated to capture data, shift data and update data. Also the shifting in and out of the data to and from the CSU Scan Unit 124 may be in parallel and provided by the PTI 102 inputs and PTP 146 outputs, or in the serial and provided by the TDI 148 input and TDO 148 output.

Figure 43:
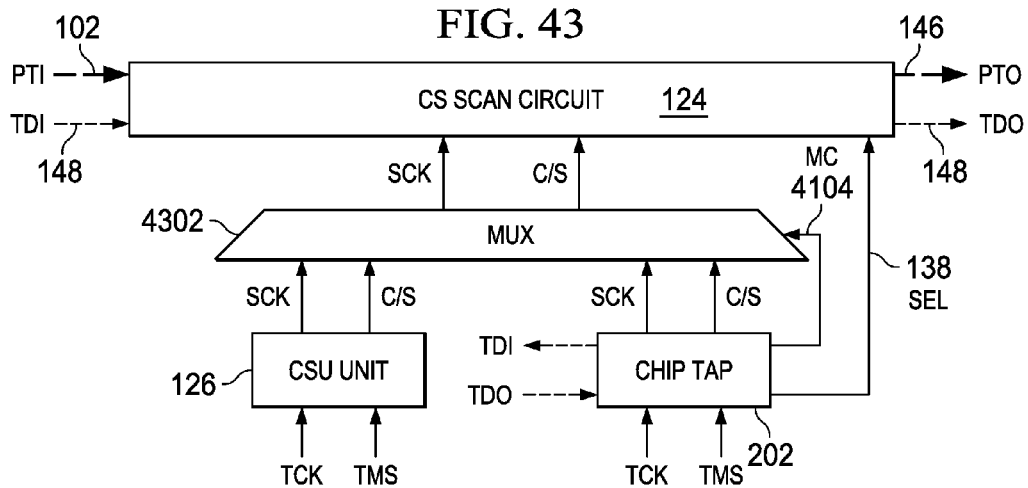
FIG. 43 illustrates a test architecture of the disclosure further including a multiplexer for allowing the SCK and C/S signals from either the CSU Unit or the Chip TAP to be coupled to the SCK and C/S of a CS Scan Circuit.

FIG. 43 illustrates how a CS Scan Circuit 124 may be selectively controlled by either the CSU Unit 126 or by the Chip TAP 202 of TAP 114 of FIG. 2 of the disclosure. As seen, a Mux 4302 has been inserted in the SCK and C/S control path to CS Scan Circuit 124. The Mux has a first input port for the SCK and C/S signals from CSU Unit 126, a second input port for the SCK and C/S signals from Chip TAP 202, an output port of SCK and C/S signals to CS Scan Circuit 124 and a Mux Control (MC) input 4104 from Chip TAP 202. If the Chip TAP is set to allow the CSU Unit 126 to control the CS Scan Circuit 124, the MC signal 4104 from Chip TAP will be set to couple the CSU Unit's SCK and C/S signals to the SCK and C/S control inputs of the CS Scan Circuit 114. In this mode the CSU Unit 126 will control the CS Scan Circuit as has been described in this disclosure in regard to FIGS. 15 and 16. However If the Chip TAP is set to allow the Chip TAP to control the CS Scan Circuit 124, the MC signal 4104 from Chip TAP 202 will be set to couple the Chip TAP's SCK and C/S signals to the SCK and C/S control inputs of the CS Scan Circuit 124. If the Chip TAP is set to control the CS Scan Circuit 124, it will control the CS Scan Circuit as shown in the timing diagrams of FIG. 44.

Figure 44:
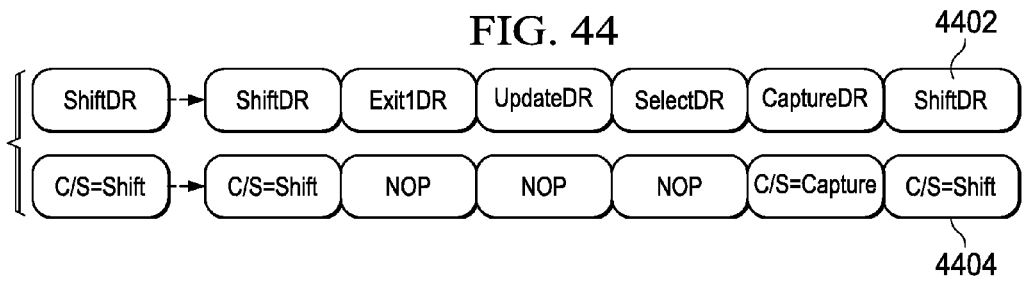
FIG. 44 illustrates Shift and Capture operations generated from the Chip TAP to control a CS Scan Circuit via the multiplexer.

In FIG. 44, there are two timing diagrams, 4402 and 4404. Timing diagram 4402 illustrates the states of the Chip TAP 202 when the Chip TAP is controlling the SCK and C/S inputs to CS Scan Circuit 124. As mentioned, these TAP states are well known in the industry. Timing diagram 4404 illustrates the control operations that take place during the TAP state sequence in timing diagram 4402, as described below.

(1) When the Chip TAP is in the ShiftDR state of diagram 4402, the C/S input from the Chip TAP is set to cause a Shift operation to occur in CS Scan Circuit 124, as seen in diagram 4404.

(2) When the Chip TAP is in the Exit1DR state of diagram 4402, a No-Operation (NOP) occurs in CS Scan Circuit 124, as seen in diagram 4404.

(3) When the Chip TAP is in the UpdateDR state of diagram 4402, a No-Operation (NOP) occurs in CS Scan Circuit 124, as seen in diagram 4404.

(4) When the Chip TAP is in the SelectDR state of diagram 4402, a NOP occurs in CS Scan Unit 124, as seen in diagram 4404.

(5) When the Chip TAP is in the CaptureDR state of diagram 4402, the C/S input from the Chip TAP is set to cause a Capture operation to occur in CS Scan Circuit 124, as seen in diagram 4404.

During either type of CS control, regardless whether the CS control comes from the Chip TAP 202 or the CSU Unit 126, the CS Scan Circuit 124 may be operated to capture data, shift data and update data. Also the shifting in and out of the data to and from the CSU Scan Unit 124 may be in parallel and provided by the PTI 102 inputs and PTP 146 outputs, or in the serial and provided by the TDI 148 input and TDO 148 output.

Note: In the Chip TAPs 202 for FIGS. 41-44, the SCK signal output from the Chip TAP 202 is actually referred to in IEEE standard 1149.1 as a Clock-DR signal output and the C/S signal output from the Chip Tap 202 is referred to as Shift-DR signal output. The SCK (Clock-DR) signal is gated on only when the Chip TAP 202 is in either the Shift-DR state or the Capture-DR state, as shown in the TAP state diagram of the referenced IEEE standard 1149.1, and if an instruction has been loaded into the Chip TAP's instruction register to select control of the CSU or CS Scan Circuits 124 of FIGS. 41 and 43.

In this disclosure the words connected and coupled both mean a "link" formed between elements mentioned in this disclosure. The elements could be, but are not limited to circuits, buses and contact points. The links may be direct links such as links formed between two elements by a conductive material or they may be indirect links such as a links formed between elements through intermediate circuitry, registered circuitry or buffered circuitry, for example.

It should be understood that while the disclosure has been described in detail, there may be alterations, additions or other changes to the test architectures taught and described herein, without departing from the spirit and scope of the disclosure.

The invention claimed is:

1. An integrated circuit die comprising:
(a) a bottom surface including bottom parallel test input signal contact points, bottom parallel test output signal contact points, a test clock in signal contact point, a test mode select in signal contact point, a test reset in signal contact point, a bottom test data in signal contact point, and a bottom test data out signal contact point;
(b) a top surface including top parallel test output signal contact points, top parallel test input signal contact points, a test clock out signal contact point, a test mode select out signal contact point, a test reset out signal contact point, a top test data out signal contact point, a top test data in signal contact point, and an UP signal contact point;
(c) test circuitry having an input coupled to the test clock in signal contact point, an input coupled to the test mode select in signal contact point, an input coupled to the test reset in signal contact point, and an input coupled to the bottom test data in signal contact point, and having control outputs;
(d) capture, shift, update circuitry having a clock input coupled with the test clock in signal contact point, a test mode select input coupled with the test mode select in signal contact point, a capture shift output, an update output, and a scan clock output; and
(e) scan circuitry having an input coupled to the bottom test data in signal contact point, an output coupled to the bottom and top test data out signal contact points, and having a capture shift input coupled with the capture shift output, an update input coupled with the update output, a scan clock input coupled with the scan clock output, and a control input coupled with a control output.

2. The integrated circuit die of claim 1 including gating circuitry coupling the bottom parallel test input signal contact points to the top parallel test output signal contact points.

3. The integrated circuit die of claim 1 in which the scan circuitry includes parallel inputs coupled to the bottom parallel test input signal contact points and parallel outputs coupled to the top parallel test output signal contact points.

4. The integrated circuit die of claim 1 in which the scan circuitry includes parallel inputs coupled to the bottom parallel test input signal contact points and parallel outputs, and including gating circuitry coupling the parallel outputs to the top parallel test output signal contact points.

5. The integrated circuit die of claim 1 including gating circuitry coupling the top parallel test input signal contact points to the bottom parallel test output signal contact points.

6. The integrated circuit die of claim 1 in which the scan circuitry includes parallel outputs coupled to the bottom parallel test output signal contact points.

7. The integrated circuit die of claim 1 in which the scan circuitry includes parallel outputs and including gating circuitry coupling the top parallel test input signal contact points and the scan circuitry parallel outputs to the bottom parallel output signal contact points.

8. The integrated circuit die of claim 1 in which the test circuitry has an output coupled to the top test data out signal contact point.

9. The integrated circuit die of claim 1 including buffer circuitry coupling the test clock in signal contact point to the test clock out signal contact point, buffer circuitry coupling the test mode select in signal contact point to the test mode select out signal contact point, and buffer circuitry coupling the test reset in signal contact point to the test reset out signal contact point.

* * * * *